United States Patent
Delic et al.

(10) Patent No.: US 11,474,215 B2
(45) Date of Patent: Oct. 18, 2022

(54) NEUROMORPHIC SINGLE PHOTON AVALANCHE DETECTOR (SPAD) ARRAY MICROCHIP

(71) Applicant: The Commonwealth of Australia, Edinburgh (AU)

(72) Inventors: Dennis Victor Delic, Canberra Airport (AU); Saeed Afshar, Canberra Airport (AU)

(73) Assignee: The Commonwealth of Australia, Edinburgh (AU)

( * ) Notice: Subject to any disclaimer, the term of this patent is extended or adjusted under 35 U.S.C. 154(b) by 314 days.

(21) Appl. No.: 16/650,561

(22) PCT Filed: Sep. 27, 2018

(86) PCT No.: PCT/AU2018/000187
§ 371 (c)(1),
(2) Date: Mar. 25, 2020

(87) PCT Pub. No.: WO2019/060942
PCT Pub. Date: Apr. 4, 2019

(65) Prior Publication Data
US 2020/0326414 A1    Oct. 15, 2020

(30) Foreign Application Priority Data
Sep. 27, 2017   (AU) .................... 2017903926

(51) Int. Cl.
*G01S 7/4863* (2020.01)
*G01S 17/894* (2020.01)
(Continued)

(52) U.S. Cl.
CPC .......... *G01S 7/4863* (2013.01); *G01S 17/894* (2020.01); *H01L 27/14643* (2013.01); *H01L 31/02027* (2013.01); *H01L 31/107* (2013.01)

(58) Field of Classification Search
CPC ............................. G01S 7/4863; G01S 17/894
See application file for complete search history.

(56) References Cited

U.S. PATENT DOCUMENTS

| 9,176,241 B2 | 11/2015 | Frach |
| 2014/0175294 A1 | 6/2014 | Frach |
(Continued)

FOREIGN PATENT DOCUMENTS

| WO | 2013018006 A1 | 2/2013 |
| WO | 2017004663 A1 | 1/2017 |

OTHER PUBLICATIONS

Belbachir et al., "High-precision shape representation using a neuromorphic vision sensor with synchronous address-event communication interface", Measurement Science and Technology, 2009, pp. 1-9, vol. 20.
(Continued)

*Primary Examiner* — Thanh Luu
(74) *Attorney, Agent, or Firm* — The Webb Law Firm

(57) ABSTRACT

Described is a Single-Photon Avalanche Diode (SPAD) array microchip comprising: a plurality of SPAD sensors; and a triggering circuit configured to detect and read out the triggering order of SPAD sensors over a timing interval wherein the timing interval comprises one or more frames. An event based neuromorphic SPAD array microchip is also described. The chip architecture and triggering methodology takes a local group of SPAD sensors connected in a certain way and by using simple digital circuits emulating how neurons behave, patterns within a local receptive field are identified. Only when these unique patterns or features are identified are "events" triggered for each receptive field in the order they occur, or in an asynchronous manner. Each neuromorphic circuit (or collection of silicon neurons) act over overlapping receptive fields, and are tiled across the
(Continued)

entire visual spatial field of the SPAD array to a form a convolution layer.

22 Claims, 16 Drawing Sheets

(51) Int. Cl.
  *H01L 27/146* (2006.01)
  *H01L 31/02* (2006.01)
  *H01L 31/107* (2006.01)

(56) References Cited

U.S. PATENT DOCUMENTS

| | | |
|---|---|---|
| 2015/0285625 A1 | 10/2015 | Deane |
| 2017/0131143 A1* | 5/2017 | Andreou ......... H01L 31/035272 |
| 2018/0195900 A1 | 7/2018 | Delic |

OTHER PUBLICATIONS

Berkovich et al., "A Scalable 20x20 Fully Asynchronous SPAD-Based Imaging Sensor with AER Readout", IEEE International Symposium on Circuits and Systems (ISCAS), 2015, pp. 1110-1113.

* cited by examiner

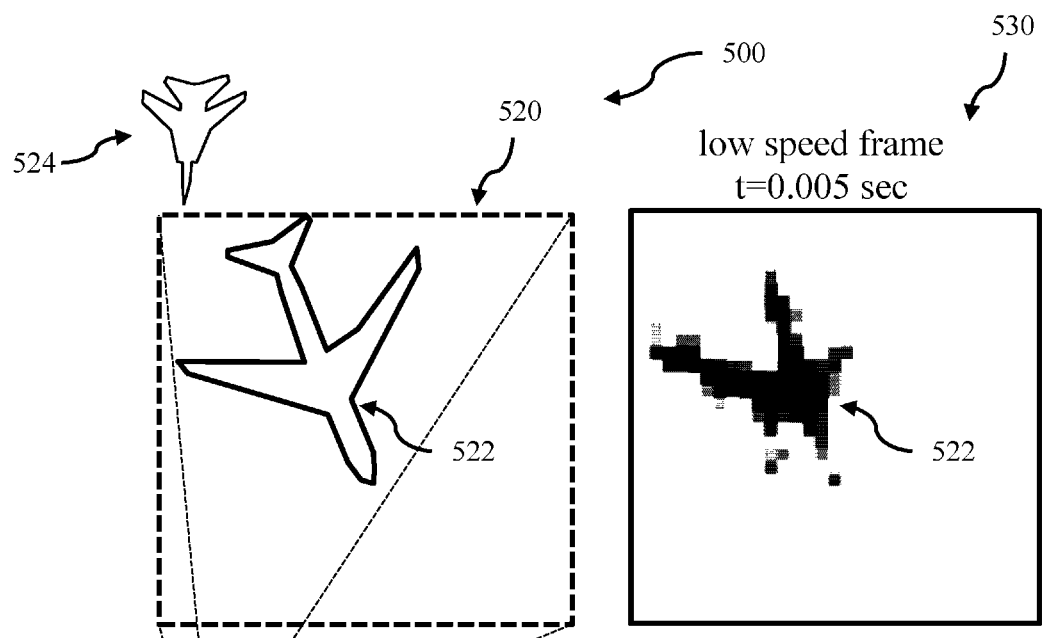
low speed frame
t=0.005 sec
Figure 5B
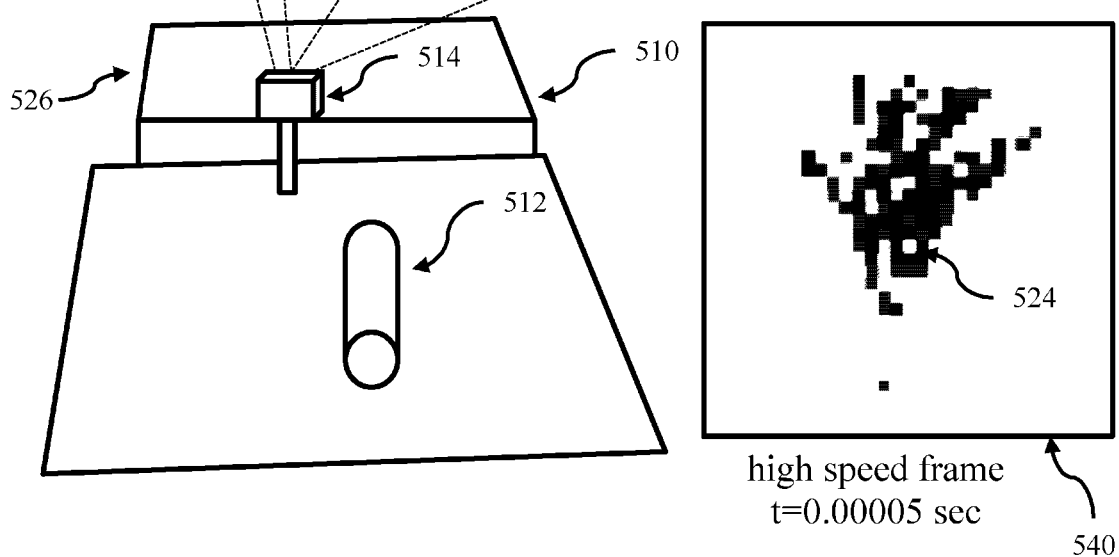
high speed frame
t=0.00005 sec
Figure 5C
Figure 5A

NEUROMORPHIC SINGLE PHOTON AVALANCHE DETECTOR (SPAD) ARRAY MICROCHIP

This application is the United States national phase of International Application No. PCT/AU2018/000187 filed Sep. 27, 2018, and claims priority to Australian Provisional Patent Application No. 2017903926 filed Sep. 27, 2017, the disclosures of which are hereby incorporated by reference in their entirety.

TECHNICAL FIELD

The present disclosure relates to sensor circuits comprising an array of Single-Photon Avalanche Diode (SPAD) circuits for three dimensional (3D) camera systems.

BACKGROUND

Avalanche photodiodes (APDs) are solid-state photodetectors in which a high bias voltage is applied to a p-n junction to provide a high first stage gain due to avalanche multiplication. Avalanche multiplication occurs when an incident photon with sufficient energy to liberate an electron arrives at the photodiode. The high electric field rapidly accelerates the photo-generated electron towards the anode, but before it can reach the anode, it collides with the intervening doped material releasing further electrons, all of which are then accelerated towards the anode. This process repeats leading to avalanche multiplication of the photo-generated electron and an output current pulse. APDs are thus semiconductor analogs to photomultiplier tubes. Linear mode APDs are effectively single stage linear amplifiers in which the gain is set by controlling the bias voltage, and with gain factors of several hundred can be achieved in linear mode.

Single-Photon Avalanche Diodes (SPADs) are APDs in which the p-n junction is biased above its breakdown voltage to operate in Geiger mode such that a single incident photon will trigger an ongoing avalanche breakdown and thus easily measureable current pulse. That is a SPAD operates as a trigger device generating a large current pulse compared to linear mode APDs in which the current pulses can be very low at low light intensity. After triggering of the SPAD, a quenching circuit is used to reduce the bias voltage below the breakdown voltage in order to quench the avalanche process. Once quenched the bias voltage is again raised above the breakdown voltage to reset the SPAD for detection of another photon (known as re-biasing the SPAD).

APD and SPADs are solid state devices and can be constructed using a variety of CMOS technologies, and have very small active areas compared with other photon counting devices such as photomultiplier tubes. Through appropriate choice of materials and structure, wavelength sensitivity of a SPAD can be controlled to be in the visible and/or near-infrared range. A SPAD combined with additional circuitry to count pulses and/or measure time of arrival of photons to sub-nano/pico second accuracy can be used to create sensors for ultra-low light imaging or highly sensitive time-resolved imaging applications. For example one potential application of a SPAD arrays are in three dimensional (3D) Flash LIDAR cameras, as they have the potential to provide extremely sensitive devices with high distance resolution and high frame rates. SPAD arrays also have potential for use in other applications that require single photo sensitivity with high frames such as biological/medical imaging applications, adaptive optics applications, and astrophysics applications.

Three dimensional Flash LIDAR systems, also known as 3D Time of Flight (TOF) Cameras, use a laser source to irradiate a target with a short duration laser pulse (i.e. a laser flash). Photons are back scattered off objects and onto the sensor and the time of arrival is used to determine time of flight and thus distance to an object. The first 3D TOF cameras were constructed as scanning laser systems comprising a laser range finder with a rotating or scanning element(s) to progressively scan the field of view. These scanning systems are effectively single pixel devices collecting time of flight information in a single direction which build up a 3D image progressively moving the pointing direction of the sensing element. More recently scanner-less (i.e. staring) 3D Flash LIDAR systems have been developed using a two dimensional array of Geiger mode APDs (pixels) to achieve more rapid scene capture than scanning systems, and to avoid problems with scanning systems such as mechanical wear, vibration, and/or motion blur. By rapidly resetting APDs after triggering, each pixel can be used to receive multiple photons from the laser pulse, each corresponding to different distance. In this way, a 3D point cloud of the target scene can be rapidly generated.

SPAD arrays in 3D Flash LIDAR systems have the potential to achieve even greater light sensitivity with high distance resolution and high frame rates than scanning laser systems or scanner-less APD based systems. In a frame based SPAD chip, each pixel or cell contains 1 or more SPADs and corresponding digital circuitry to time photon events (known as Time of Flight or ToF Mode) or to count photon events (known as photon counting mode. In photon counting mode, counters integrated to each SPAD cell keep a count of the number of arriving photons at each cell and effectively provide a measure of illumination, and the illuminator/laser can be omitted in which case the camera operates as a low light imager (images are intensity only 2D images). In DTOF timing mode, the integrated counters are triggered to start counting by the laser pulse and stop counting at the detection of the first photon. ToF techniques can be grouped into direct ToF or (dToF) and indirect (iToF) categories. Direct ToF methods directly measure the time delay by means of a very accurate timer or a Time-to-Digital (TDC) converter situated in the pixel. Depending on the accuracy or resolution of the timer, this method is typically used for long (kilometres) distance measurements and at very high precision (millimetre) depth resolutions. The Indirect ToF method in contrast reconstructs the time delay (hence distance) from the measurement of the phase delay of the reflected signal when compared to the periodic emitted light signal. This technique is more suited to short or medium distances (tens of meters) and with depth resolutions of some centimetres. For the iToF technique, either a continuous-wave iToF (cw-iToF) can be implemented, whereby a sinusoid modulated light source illuminates the scene and the returned signal is sampled a few times during the modulation period in order to compute the phase delay, or a pulsed-light iToF (p-iToF) method where the illuminator uses square pulses of light. This work will focus on using SPAD technology to implement specifically dToF methods for LADAR imaging.

The data generated by DToF SPAD arrays is a three dimensional time surface corresponding to the relative distance of the visual scene to the camera and illuminator. In DTOF mode a high speed precision counter is used for each SPAD cell to encode the time of flight of the arriving photons. Each frame comprises firing a laser pulse and synchronising the counters for each of the SPADs to the time of firing of the laser pulse. When a SPAD is triggered (i.e. due to an arriving photon), the counter is latched. At the end of the frame (e.g. max counter value) the counter values of SPAD cells must be read off chip for processing (i.e. to build up a 3D spatial picture of the target scene). As the photons are travelling at the speed of light, a single frame can be taken in the space of a few hundred nanoseconds after each laser pulse. This data transfer process creates an information bottleneck as significant bandwidth is required to transfer data from each of the SPAD cells, which is currently a major limiting factor in the speed of operation of such cameras. Further this bottleneck grows with increasing SPAD array size.

There is thus a need to provide an improved SPAD array system for 3D imaging applications at least provide a useful alternative to current DToF SPAD array systems.

SUMMARY

According to a first aspect, there is provided a method for operation of a Photon Avalanche Diode (SPAD) array microchip, the method comprising:

detecting, on board a SPAD array microchip comprising a plurality of SPAD sensors, the triggering of one or more SPAD sensors during a timing interval, wherein the timing interval comprises one or more frames; and reading out an address of each triggered SPAD sensor or an identifier that identifies the location of a group of triggered SPAD sensors in the order of triggering during the timing interval.

In one form, detecting the triggering of one or more SPAD sensors comprises:

detecting, on board the microchip, the triggering of a group of SPAD sensors matching one of a plurality of predefined triggering patterns during a frame, and the step of reading out the address comprises:

reading out an identifier of the triggering pattern which identifies the location of the group of SPAD sensors, or the addresses of the SPAD sensors in the group of SPAD sensors, only if the group of SPAD sensors matching the predefined pattern has not previously been detected during the timing interval.

In a further form:

the plurality of SPAD sensors are each associated with one or more or a plurality of receptive field groups where each receptive field groups comprises a receptive group of SPAD sensors, and different receptive field groups may share some but not all of the same SPAD sensors; and the plurality of predefined triggering patterns comprises a plurality of neural feature subgroups where each receptive field comprises a two or more neural feature subgroups where the respective neural feature subgroups comprise different subgroups of the SPAD sensors from the receptive group of SPAD sensors; and detecting the triggering of a group of SPAD sensors matching one of a plurality of predefined triggering patterns comprises:

detecting the triggering of a neural feature subgroup of a receptive field, and wherein upon detection the triggering of each other neural feature subgroup in the same receptive field group is suppressed until the end of the current frame;

generating an event trigger for the receptive field group if the triggered neural feature subgroup is the first neural feature subgroup in the receptive field to trigger in the timing interval or if the triggered neural feature subgroup is different to the neural feature subgroup which previously triggered in the timing interval for this receptive field;

and the step of reading out an identifier is performed upon generation of an event trigger, and comprises reading an address of the neural feature subgroup that triggered.

In a further form, generating an event trigger for the receptive field group further comprises incrementing a counter if the neural feature subgroup that triggered is the same neural feature subgroup that generated the previous trigger or the counter is zero, otherwise decrementing the counter;

generating an event trigger for the receptive field group only when the counter reaches a predefined counter threshold value wherein the predefined counter threshold value is fixed for at least the timing interval. In a further form, the counter is decremented if the counter is greater than zero and the neural feature subgroup that triggered is not the same neural feature subgroup that generated the previous trigger.

In a further form, each receptive field group has the same geometry each of the neural feature subgroups in a receptive field group comprises the same number of SPAD sensors. In a further form, the plurality of SPAD sensors are arranged in a R×C grid, and each receptive field group is an r×r array of SPAD sensors, and the plurality of receptive field groups overlap, and the plurality of overlapping receptive field groups tile the R×C grid. In a further form, each neural feature group comprises a contiguous block of the r×r array of SPAD sensors in the receptive field group. In a further form, r=4, and each neural feature group comprises a block of 8 adjacent SPAD sensors arranged in a 2×4 or 4×2 grid.

In one form after reading out an identifier the plurality of SPADs are reset and the current frame ends, an in use the start of each frame is synchronised to a laser pulse.

According to a second aspect, there is provided a Single-Photon Avalanche Diode (SPAD) array microchip comprising:

a plurality of SPAD sensors;

a triggering circuit configured to detect and read out the triggering order of SPAD sensors over a timing interval wherein the timing interval comprises one or more frames.

In one form the triggering circuit comprises:

a plurality of feature detection circuits, each feature detection circuit connected to a group of SPAD sensors and configured to generate a feature trigger when the connected SPADs satisfy a triggering criteria;

an event detection circuit configured to detect the first time a feature trigger is generated by a feature detection circuit during a timing interval wherein the timing interval comprises one or more frames and to read out the address of either the feature detection circuit or the connected SPAD sensors off the microchip.

In a further form, the feature detection circuits are neural feature detection circuits and the triggering circuit further comprises:

a plurality of receptive field circuits wherein each receptive field circuit comprises:

a receptive group of SPAD sensors;

two or more neural feature circuits, wherein each neural feature circuit comprises a subgroup of SPAD sensors in the receptive group of SPAD sensors where the respective neural feature subgroups comprise different subgroups of the SPAD sensors from the receptive group of SPAD sensors, and each neural feature circuit is configured to generate a neural feature trigger signal and an inhibit signal if all the SPAD sensors in the subgroup trigger, wherein the inhibit signal prevents triggering of the other neural feature circuits in the same receptive field circuit during the current frame; and the event detection circuit comprises an event detection circuit for each receptive field circuit which is configured to monitor the neural feature circuits for generation of a neural feature trigger signal, and generates an event trigger for the receptive field circuit if the neural feature circuit which generated the neural feature trigger signal is the first neural feature circuit in the receptive field to trigger in the timing interval or if the triggered neural feature subgroup is different to the neural feature circuit most previously triggered in the timing interval; and the triggering circuit further comprises a read out circuit which detects an event trigger from a receptive field circuit, and on detection of an event trigger it reads an address of the neural feature circuit that triggered generation of the event trigger.

In a further form, each receptive field circuit further comprises a memory, and when a neural feature trigger signal is generated an identifier of the neural feature circuit that generated the neural feature trigger signal in stored in the memory, and the event detection circuit is configured to determine if the neural feature circuit which generated the neural feature trigger signal is the first neural feature circuit in the receptive field to trigger in the timing interval or if the triggered neural feature subgroup is different to the neural feature circuit most previously triggered in the timing interval by comparing an identifier of the neural feature circuit that generated the neural feature trigger with the identifier stored in the memory.

In a further form, each receptive field circuit further comprises a counter wherein the counter is incremented the neural feature circuit which generated the neural feature trigger signal is the first neural feature circuit in the receptive field to trigger in the timing interval or if the identifier of the neural feature circuit that generated the neural feature trigger is the same as the identifier stored in the memory, and an event trigger is generated when the counter is equal to a predetermined threshold value fixed for at least the timing interval. In a further form, the counter is decremented if the counter is greater than zero and the neural feature subgroup that triggered is not the same neural feature subgroup that generated the previous trigger.

In a further form, each of the neural feature circuits in a receptive field comprises the same number of SPAD sensors. In a further form, the plurality of SPAD sensors are arranged in a R×C grid, each receptive field circuits is an r×r array of SPAD sensors, and the plurality of receptive field circuits overlap, and the plurality of overlapping receptive field circuit tile the R×C grid. In a further form, each neural feature circuit comprises a contiguous block of the r×r array of SPAD sensors in the receptive field circuit. In a further form, r=4, and each neural feature circuit comprises a block of 8 adjacent SPAD sensors arranged in a 2×4 or 4×2 grid.

In one form, each neural feature circuit comprises a logical circuit which ANDs each of the subgroup of SPAD sensors.

In one form, the predetermined threshold value is adjustable between timing intervals.

In one form, the chip further comprises a data bus and an Address Event Representation protocol is used to read data off the microchip In one form, after reading out the address the plurality of SPAD sensors are reset and the current frame ends, an in use the start of each frame is synchronised to a laser pulse.

BRIEF DESCRIPTION OF DRAWINGS

Embodiments of the present disclosure will be discussed with reference to the accompanying drawings wherein:

FIG. 5A is an experimental setup with a SPAD field of view marked by black dotted line a according to an embodiment;

FIG. 5B shows 500 averaged frames showing a stationary B-747 model viewed using the experimental setup of FIG. 5A;

FIG. 5C shows the result of averaging 5 frames showing an F-14 model plane as it drops at high speed close to the camera lens in the experimental setup of FIG. 5A;

In the following description, like reference characters designate like or corresponding parts throughout the figures.

DESCRIPTION OF EMBODIMENTS

Embodiments of a single photon avalanche detector (SPAD) array microchip, and methods of operation are described. With conventional (Frame based) SPAD microchip designs as used in 3D ToF cameras, each pixel or cell contains 1 or more SPADs and corresponding digital circuitry to time when photon events occur. For every pixel the ToF data is collectively communicated off chip synchronous with a laser pulse. With more pixels (higher resolution arrays) come the problems of how to reduce circuit complexity without compromising functionality and how to move large amounts of ToF data off chip. Embodiments of a single photon avalanche detector (SPAD) array microchip, and methods of operation are described in which the inter pixel photon arrival order (not time) is recorded and transmitted off chip.

Figure 1A:
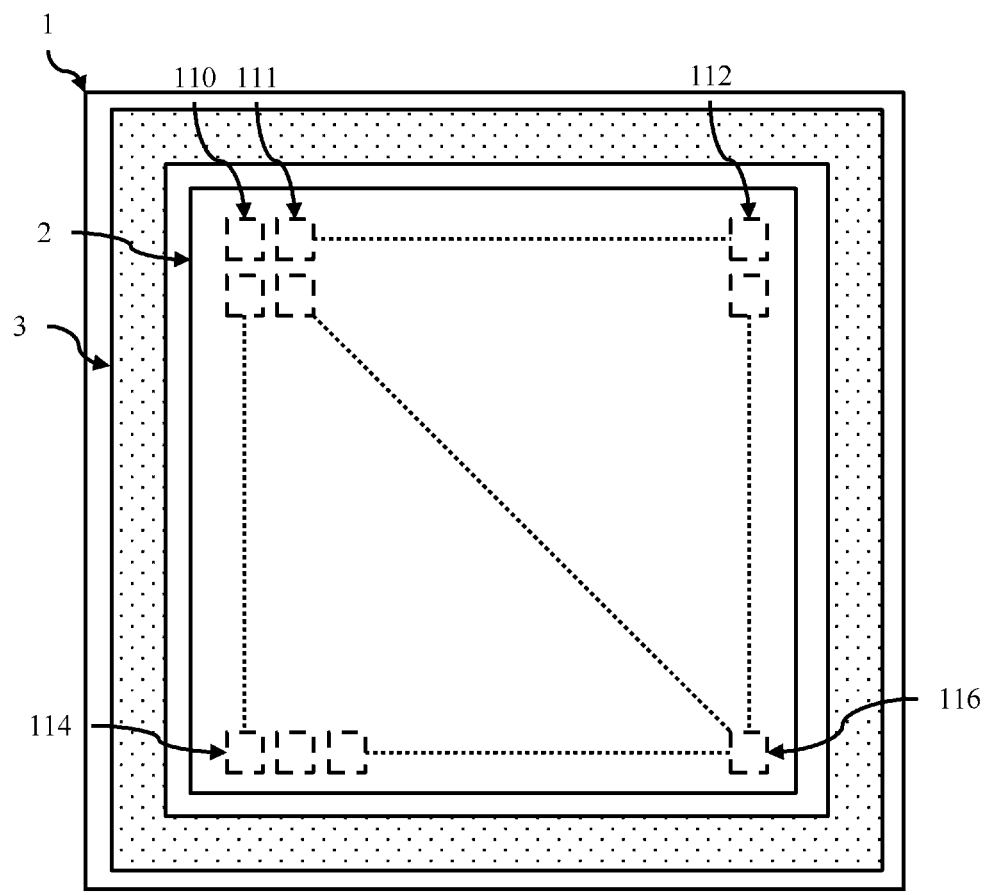
FIG. 1A is a schematic diagram of a SPAD array sensor according to an embodiment.

Referring now to FIG. 1A, there is shown a schematic diagram of a SPAD array sensor 1 according to an embodiment. The SPAD array sensor comprises a SPAD array 2 and a SPAD Array control circuit 3. The SPAD array 2 comprises an array of SPAD cells 110, arranged in n rows and m columns (i.e. a n×m array). This is illustrated in FIG. 1, in which the first row comprises a first SPAD cell 10 in the first column, a second SPAD cell 111 in the second column, etc. to the mth SPAD cell 112 in the mth column. This structure is repeated for n rows, and thus the nth row comprises the $((n-1) \times m)+1$ th SPAD cell 114 in the first column of the nth row to the n×m th SPAD cell 116 in the mth column of the nth row. The SPAD array control circuit performs a range of functions such as providing power to the array, and controlling trigger enablement and resetting of SPAD sensors or SPAD cells, and reading of data from cells in the array.

Figure 1B:
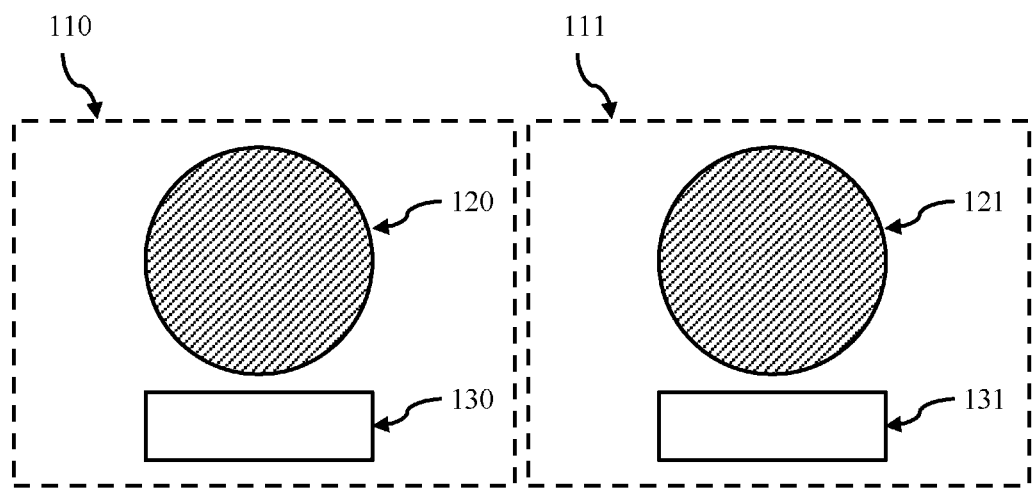
FIG. 1B is a schematic diagram of adjacent SPAD cells according to an embodiment.

FIG. 1B is a schematic diagram of adjacent SPAD cells 110 and 111 according to an embodiment. In this embodiment the first SPAD cell 110 comprises a SPAD structure 120, and a quenching circuit 130. The second SPAD cell 111 is of identical construction to the first SPAD cell, and comprises a second SPAD structure 121 and a second quenching circuit 131. As will be discussed below a triggering circuit detects triggering of the SPAD sensors. As will be discussed below, in some embodiments the triggering circuit comprises neural feature circuits. In one embodiment the quenching circuits 130, 131 are analog circuits and the triggering circuit is a digital circuit.

The SPAD array microchip may be constructed using a range of CMOS technologies, for example from 0.8 μm down to 65 nm (and potentially lower) incorporating multiple metal layers and voltages, and may be designed using VLSI and related IC chip design techniques. In one embodiment the SPAD array sensor is constructed as a monolithic CMOS wafer comprised of the SPAD array and a SPAD control circuit. In other embodiments, multi-wafer layering techniques can be used, in which the top wafer layer is a comprised of an array of SPAD structures, and the lower wafer layer(s) comprise associated SPAD structure quenching circuit and triggering circuits connected to SPAD structures in the top wafer layer, and the SPAD array control circuit.

The SPAD sensor comprises a SPAD structure which comprises an active region, within which an incident photon will generate an output current pulse, which may also be referred to as a trigger pulse as well as anode and cathode connections for application of the bias voltage and detection of the trigger pulse. Various SPAD structures may be used with different SPAD structures having different efficiencies and characteristics.

A quenching circuit is used to control the bias voltage applied to the SPAD structure and quench (i.e. stop) the avalanche process by reducing the bias voltage below the breakdown voltage. The quenching circuit may also be referred to as a quenching and recharge circuit, as once the avalanche process is quenched, the bias voltage is again raised to the operational voltage above the breakdown voltage to allow the SPAD to be triggered again. Quenching may be performed using active or passive quenching. Passive quenching is performed by providing a resistance in series to the SPAD. The avalanche current self-quenches simply because it develops a voltage drop across the resistance (a high-value ballast load), reducing the voltage across the SPAD to below its breakdown voltage. After the quenching of the avalanche current, the SPAD's bias slowly recovers to at or above the breakdown voltage. An alternative to passive quenching is active quenching. An active quenching circuit detects avalanche breakdown by a digital logic circuit or component, for example a transistor acting as a resistive element or a transistor based circuit connected to the SPAD output. Upon detection of a trigger pulse, the active quenching circuit actively pulls the bias voltage to a voltage below breakdown to quench the avalanche, before switching the voltage back to the operational voltage. Compared to passive quenching, active quenching circuits occupies less space on the chip and have reduced dead time, as well as providing options such as time gating of the SPAD to synchronise with firing of a laser pulse. In one embodiment the quenching circuits are analog circuits and the triggering circuits are digital circuits.

Figure 1C:
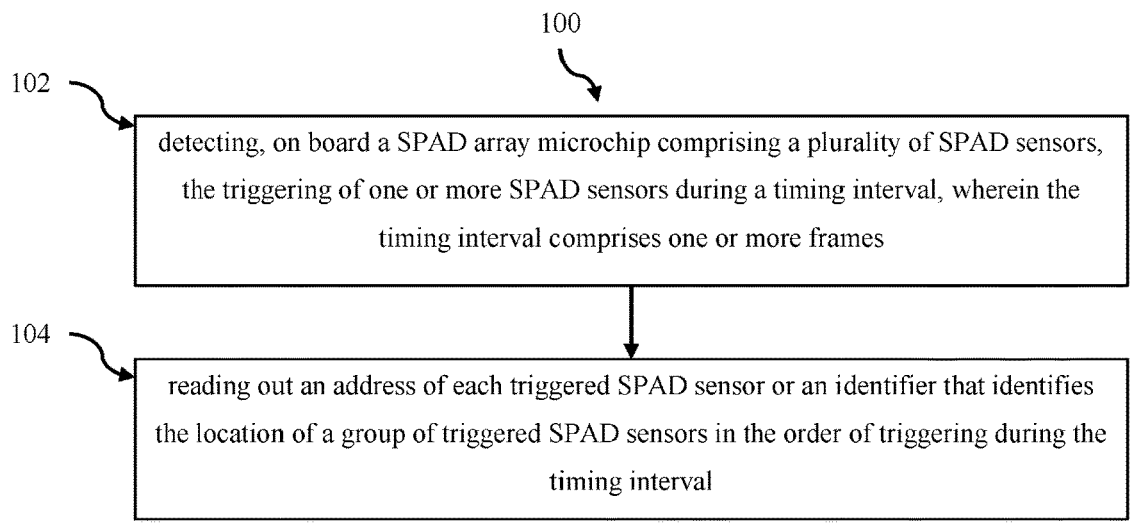
FIG. 1C is a flowchart of a method of operation of a SPAD array microchip according to an embodiment.

FIG. 1C is a flowchart of a method of operation of a SPAD array microchip 100 according to an embodiment. In contrast to traditional SPAD DTOF systems, the inter pixel photon arrival order (not time) is recorded and transmitted off chip using this method. The method broadly comprises step 102 of detecting, on board a SPAD array microchip comprising a plurality of SPAD sensors, the triggering of one or more SPAD sensors during a timing interval, wherein the timing interval comprises one or more frames. In some embodiments, only one event is read per frame (where the start of the frame is defined by the laser firing), and in other embodiments, multiple events can be read per frame, each from different receptive fields (described below). In one embodiment the detection step comprises detecting the triggering of a group of SPAD sensors matching one of a plurality of predefined triggering patterns during a frame. At step 104, the method continues with reading out an address of each triggered SPAD sensor or an identifier that identifies the location of a group of triggered SPAD sensors in the order of triggering during the timing interval. In some embodiment this comprises reading out an identifier of the triggering pattern which identifies the location of the group of SPAD sensors (i.e. indirectly reading out the addresses of the triggered SPAD sensors), or the addresses of the SPAD sensors in the group of SPAD sensors. This is only performed if the group of SPAD sensors matching the predefined pattern has not previously been detected during the timing interval.

In one embodiment the design is a "synchronous" logic circuit with an external clock that drives all the internal logic circuits. SPADs avalanching are synchronised to this clock (although in other embodiments this restriction can be relaxed) so that "events" triggered by the receptive fields occur synchronous to this clock. Exactly when these events actually occur is unknown, and thus the system can be described as asynchronous in nature between frames (the frame itself is synchronised to the start of the laser pulse). The time when the event occurs is not time stamped (or recorded). However in one embodiment a global counter could be used to time stamp events: In this embodiment the chip operates in timing mode, and is synchronized to the firing of a laser pulse where each laser pulse presents the start of a new frame. A counter is latched at the time the event is read off the chip and based on the clock frequency (period of each clock tick) a time can be determined which can be converted to a distance by multiplying by the speed of light. This allows the use of a single counter for the chip, with this counter synchronised to the laser pulse (i.e. start of the frame). This counter could be located on the chip or off the chip as part of a control circuit 3 associated with reading events off the chip and resetting the chip. In one embodiment the control circuit comprises a processor such as a FPGA which reads the addresses of events off the chip and which comprises a counter which is read each time an event is read off the chip. A timing interval can be defined which is a plurality of frames. Over successive frames new events corresponding to newly detected features are read out and the time latched. In some embodiments only one event is read out per frame, and over a consecutive series of frames (the timing interval) a 3D representation of the scene can be created. In other embodiments, multiple events per frame may be read out and the times latched in which case several counters may be required, or the counter value must be latched and stored with the event without stopping the counter.

This method and embodiments of a microchip and associated circuits for implementing this method will now be discussed in greater detail to more clearly highlight the various features of the method and implementation.

To assist in understanding the invention we will first consider an embodiment where the SPAD array microchip is a regular array with SPAD sensors arranged in an R×C grid. In this event based triggering approach we introduce the concept of a receptive field. Each receptive field 210 is group of SPAD sensors—equivalently a macro cell of neighbouring SPADs. Preferably each receptive field is a r×r array of SPAD sensors or a contiguous block of SPAD sensors. The receptive fields are tiled across the array in an overlapping pattern so that adjacent receptive fields share some but not all of the same SPAD sensors. For example in a 128×128 SPAD array chip, with receptive fields with a 4×4 shape, the entire chip contains 125×125 receptive field block and each receptive field shares overlapping SPADs with adjacent receptive fields.

Figure 2A:
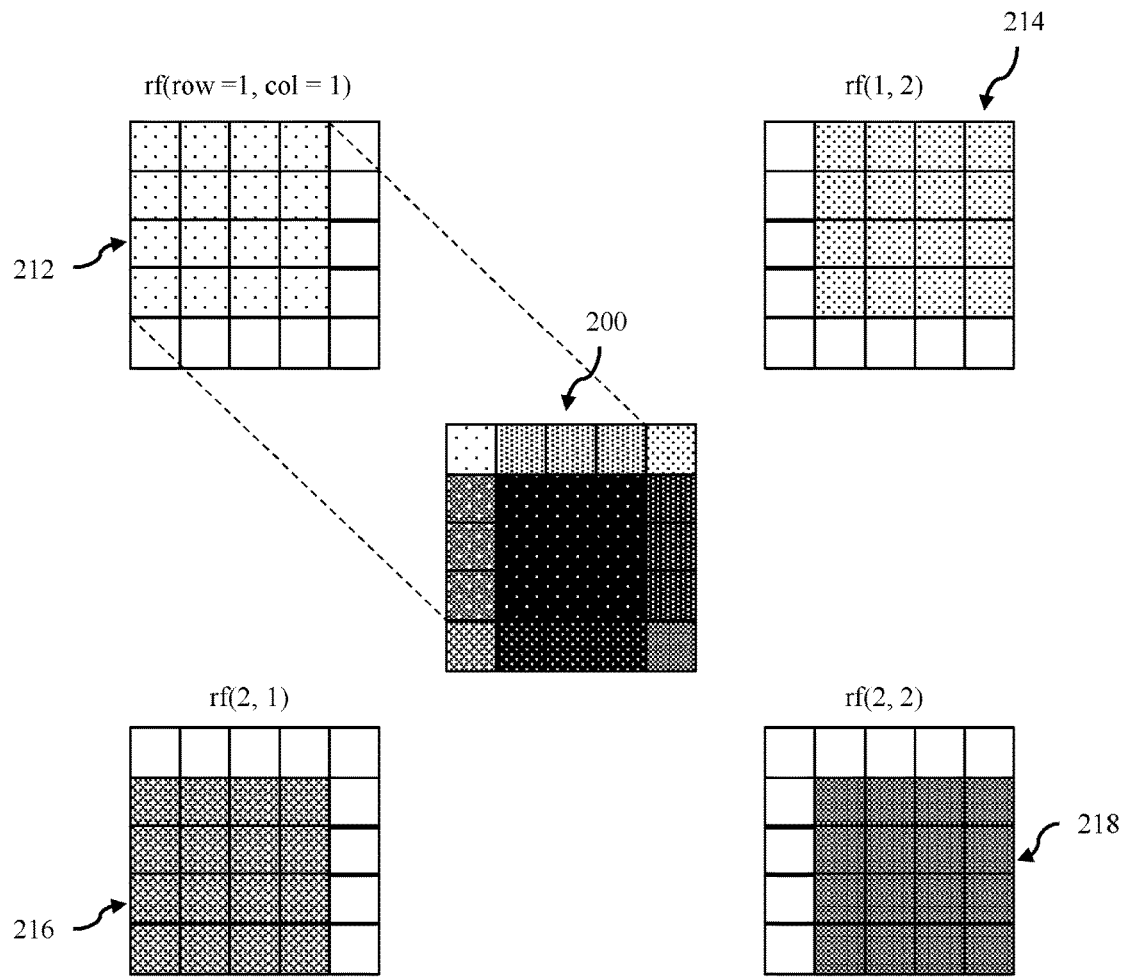
FIG. 2A is an illustrative example of a 5×5 SPAD array microchip with four 4×4 receptive fields according to an embodiment.

FIG. 2A is an illustrative example of a 5×5 SPAD array microchip 200 with four 4×4 receptive fields 212, 214, 216, and 218. That is each receptive field connects 16 neighbouring SPADs in a 4×4 arrangement. Each receptive field is assigned an address based on the (row, column) location of the top corner. For example in FIG. 2A, the first receptive field 212 is indicated with lightly shaded boxes (coloured yellow in the provisional) and has an address of rf(1, 1), the second receptive field 214 is shifted one column to the right and has slightly heavier shading (coloured green in the provisional) has an address of rf(1, 2). The third receptive field 216 is shifted one row down and has medium shading (coloured red in the provisional) and has an address of rf(2, 1), and the fourth receptive field 218 is shifted one column right and one column down and is more darkly shaded (coloured blue in the provisional) and has an address of rf(2, 2). The overlapping receptive fields are shown on 5×5 SPAD array microchip 200. The interior 3×3 cells have the darkest shading, each corner has the shading of their respective source (212, 214, 216, 218) and the 3 border have intermediate shading based on the two bordering end cells.

Each receptive field comprises its own circuitry that digitally processes its own group of SPAD cells to identify the presence of one or more features with a predefined triggering pattern. These will be referred to as neural feature subgroups or neural feature circuits. Each neural feature circuit comprises a subgroup of the SPAD sensors in the receptive field, and the neural feature circuit is configured to detect a triggering pattern within this subgroup. The neural feature groups are thus feature shapes, and are analogous to silicon neurons. Each receptive circuit comprises two or more neural feature subgroups or circuits and where each neural feature subgroups comprise different subgroups of the SPAD sensors from the receptive group of SPAD sensors. In the present example 4 features are used, but it could be higher or lower as required.

In most embodiments, the neural feature circuits are created using an AND gate which takes as input a local group of SPAD sensors and which outputs a neural feature trigger signal when all the input SPADs are triggered (i.e. the AND gate is use to combine all of the SPADs in the subgroup so the feature is only triggered when all SPADs in the feature have triggered). However other more complex digital circuits can be used to capture more complex triggering patterns, including non-triggering of some SPADs in the neural feature group. In this case a logic circuit generates a neural feature trigger signal when the predetermined trigger pattern of SPAD is satisfied.

Preferably the number of input SPAD sensors per AND gate is equal for each neural feature circuit so as to result in an equal probability of AND gate activation. That is each of the neural features in a receptive field comprises the same number of SPAD sensors. However the pattern of connectivity and its correspondence to the observed data also determines AND gate activation. For example an edge bar is more likely to be activated in a natural environment in comparison to a checker board pattern since the latter is not typically observed in the environment. In this way each AND gate encodes a local feature and it's activation indicates that all its input signals have been activated. Thus in most embodiments each of the neural feature circuits in a receptive field are contiguous block with the same shape, for example a rectangular 2×4 or 4×2 group of SPADs. In other embodiments the neural features could comprise solid squares, lines, rectangles, L shaped blocks, regular polygons (hexagon, octagon), crosses, etc. In the example shown in FIG. 2A each receptive field comprises 16 SPAD sensors, with four neural features.

Figure 2B:
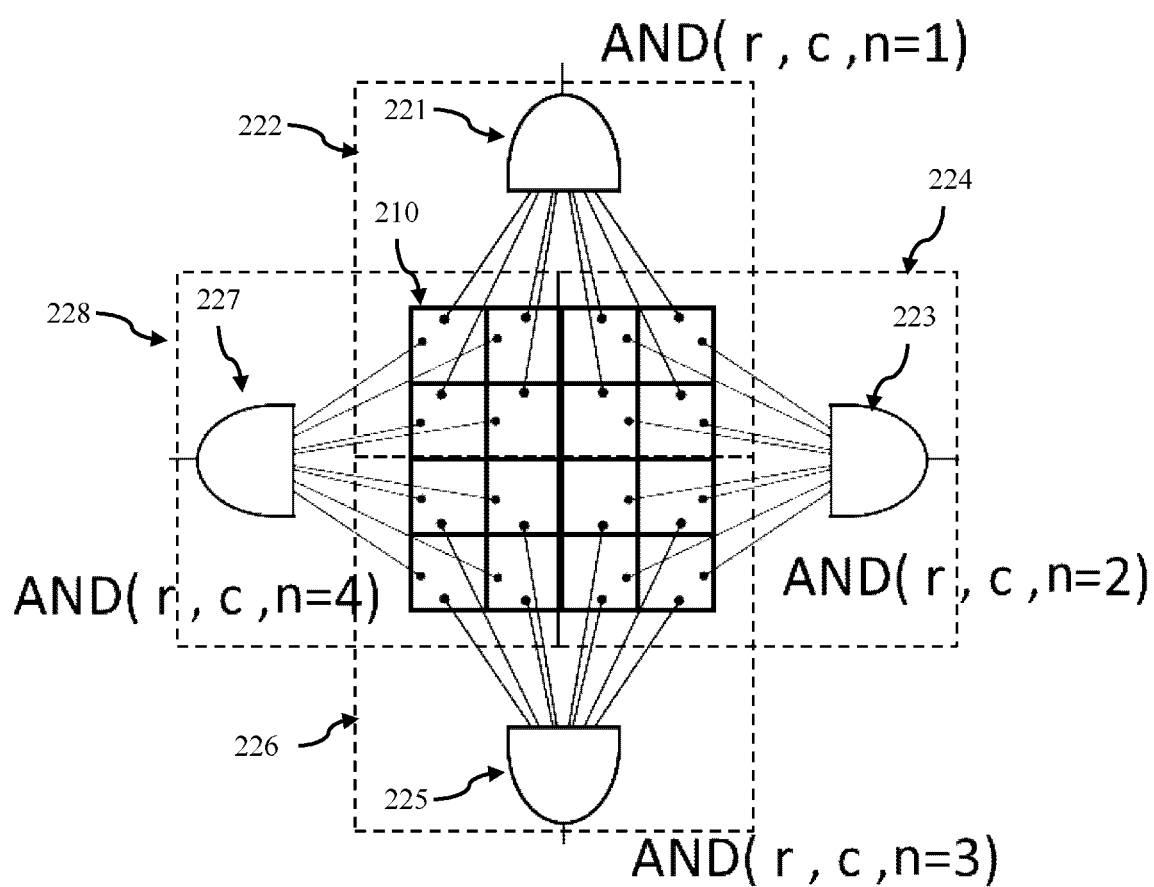
FIG. 2B is a schematic representation of a 4×4 receptive field illustrating the connection of the SPAD sensors to four AND gates to create four neural feature circuits according to an embodiment.

FIG. 2B is a schematic representation of a 4×4 receptive field 210 illustrating the connection of the 16 SPAD sensors to four AND gates 221, 223, 225, and 227 to create four neural feature circuits 222, 224, 226, and 228. In this embodiment each neural feature group is a block of 8 adjacent SPAD sensors arranged in a 2×4 or 4×2 grid (i.e. edge bar patterns). Each neural feature circuit has an associated address for example based on the (row, column) location of the receptive field, and an identifier of the neural feature circuit. For example in this embodiment the circuits

222, 224, 226, and 228 are in north, east, south and west locations and are assigned identifiers 1, 2, 3, 4. A unique address for the SPAD arrays in a neural feature circuit can thus be provided by the (row, column) address of the receptive field, and the identifier (n=1 . . . 4) of the neural circuit within the receptive field. In other embodiments the address of the neural feature could be specified by the (row, column) of a first or reference cell in the neural feature shape (e.g. top left corner of the shape). In one embodiment, the unique address of the receptive field is known and only the "winning" neuron feature (or feature event) within that receptive field is known (or detected/stored). One neural circuit is provided for every receptive field and is configured to record/detect/store the neuron feature that triggered an event. In this embodiment the address of "every neural feature" in a receptive field is not known or recorded.

Figure 2C:
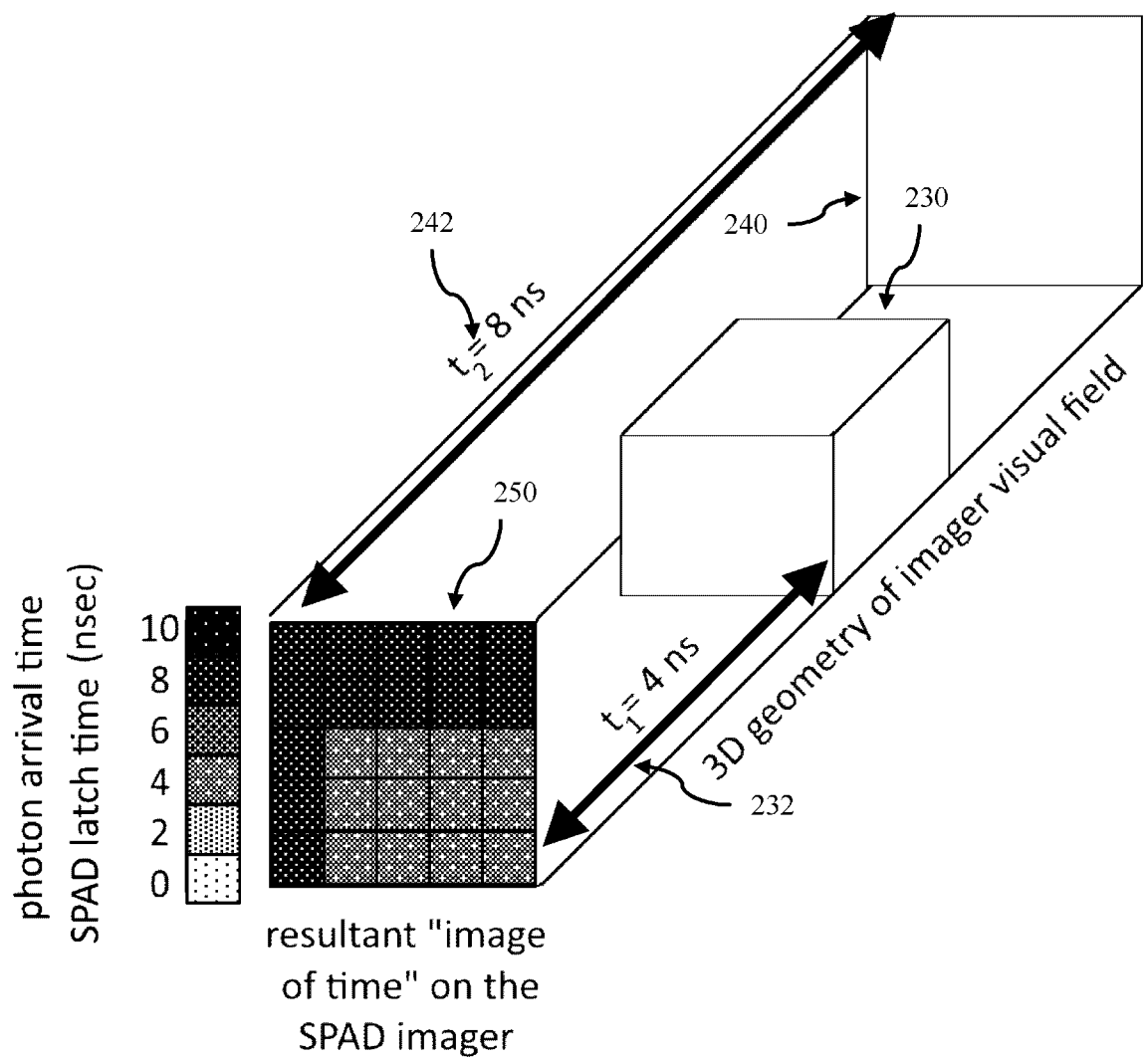
FIG. 2C is a representation of a 3D visual scene and the resultant SPAD timing pattern for the 5×5 SPAD array microchip of FIG. 2A according to an embodiment.

FIG. 2C is a representation of a 3D visual scene and the resultant SPAD timing pattern for the 5×5 SPAD array microchip of FIG. 2A according to an embodiment. In this embodiment a box 230 is in the foreground and returns a signal 232 over a first time $t_1$=4 ns. The background 240 is far away (i.e. no objects) at the maximum range (time $t_2$=8 ns). The box occupies pixels (row=3:5 and col=2:5), then the lower/south AND of rf(1,2) (green) and rf(2,2) (blue) will latch which can be expressed as AND(1,2,3) and AND(2,2, 3) latching at t=4 ns. The resultant image of time 250 on the 5×5 SPAD imager is colour coded according to the photon arrival time or equivalently the SPAD latch time (nsec) for each detected event. In this figure the image comprises a 3×4 medium shaded (orange in the provisional application) block of pixels corresponding to a time of 4 ns, and the remaining pixels are dark shaded (red in the provisional) at time $t_2$=8 ns.

Another feature of the receptive field circuit, is that as a neural feature trigger signal is generated, an inhibit signal is also generated which suppresses (i.e. prevents) triggering of the other neural feature circuits in the same receptive field circuit during the current frame.

That is the going high or latching of the first AND gate (first neural feature circuit) prevents subsequent latching of any later neurons (other neural feature circuit) via a recurrent enable connection that gates all the ANDs. Thus, at the beginning of the pulse cycle when the laser pulse is sent, the enable to all ANDS for all the receptive fields are high allowing any AND gate to latch but then for each receptive field as soon as the first AND gate latches the enable to the other ANDs of this receptive field is set low. Note that the enable flag going low does not affect the first AND gate that caused the lowering in the first place. This is achieved by the AND gate blocking its own blocking signal. This is realised through the following logic: an AND gate can only be high if and only if all its input pixels are high and (the local receptive fields enable flag is high or the AND was already high (In the previous time step in a synchronous system or an asynchronous memory in an asynchronous implementation)).

Figure 3A:
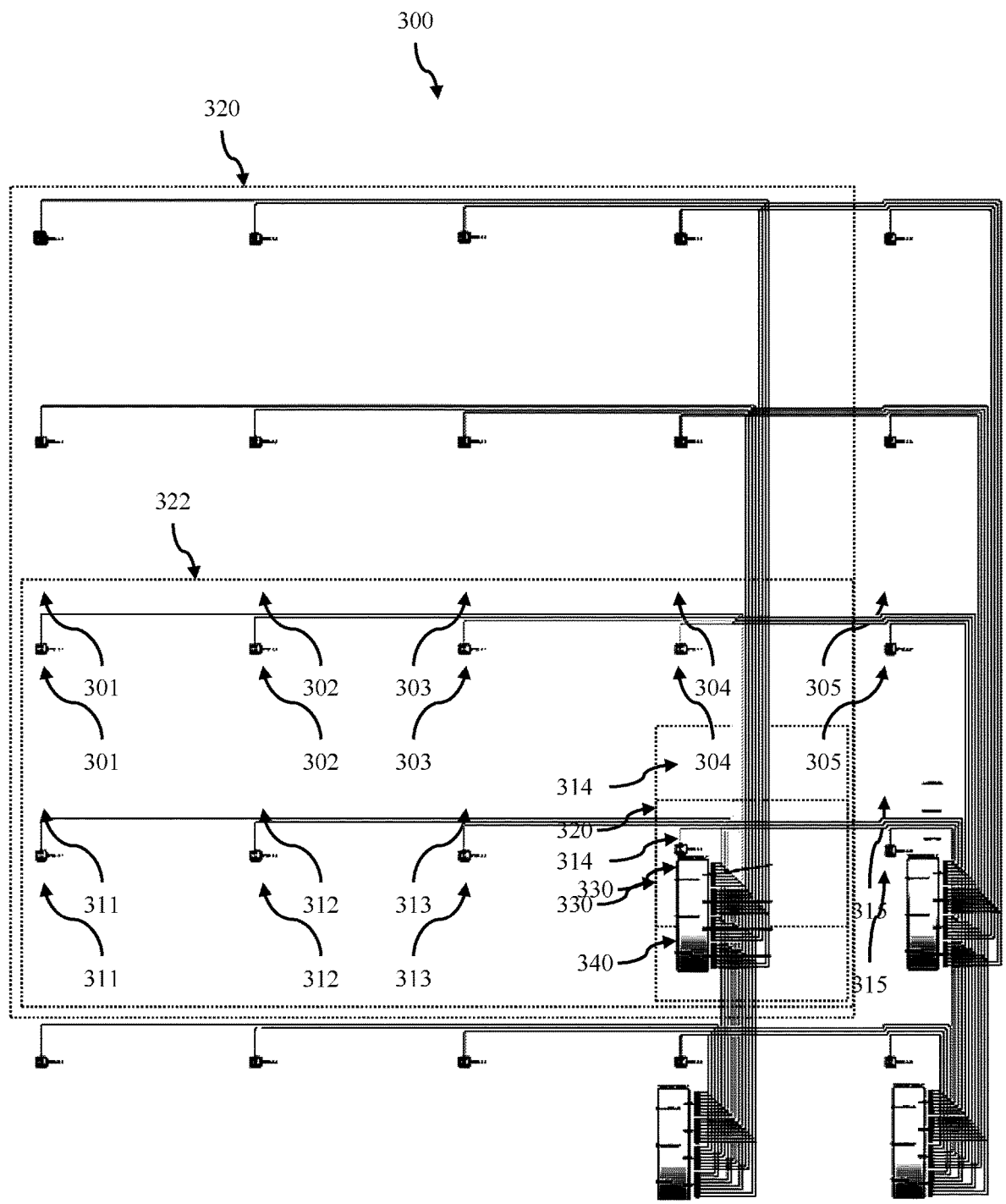
FIG. 3A is a schematic wiring diagram of the a 5×5 imager with four 4×4 receptive fields shown in FIG. 2A where each receptive field is connected to four AND gates a according to an embodiment.
Figure 3B:
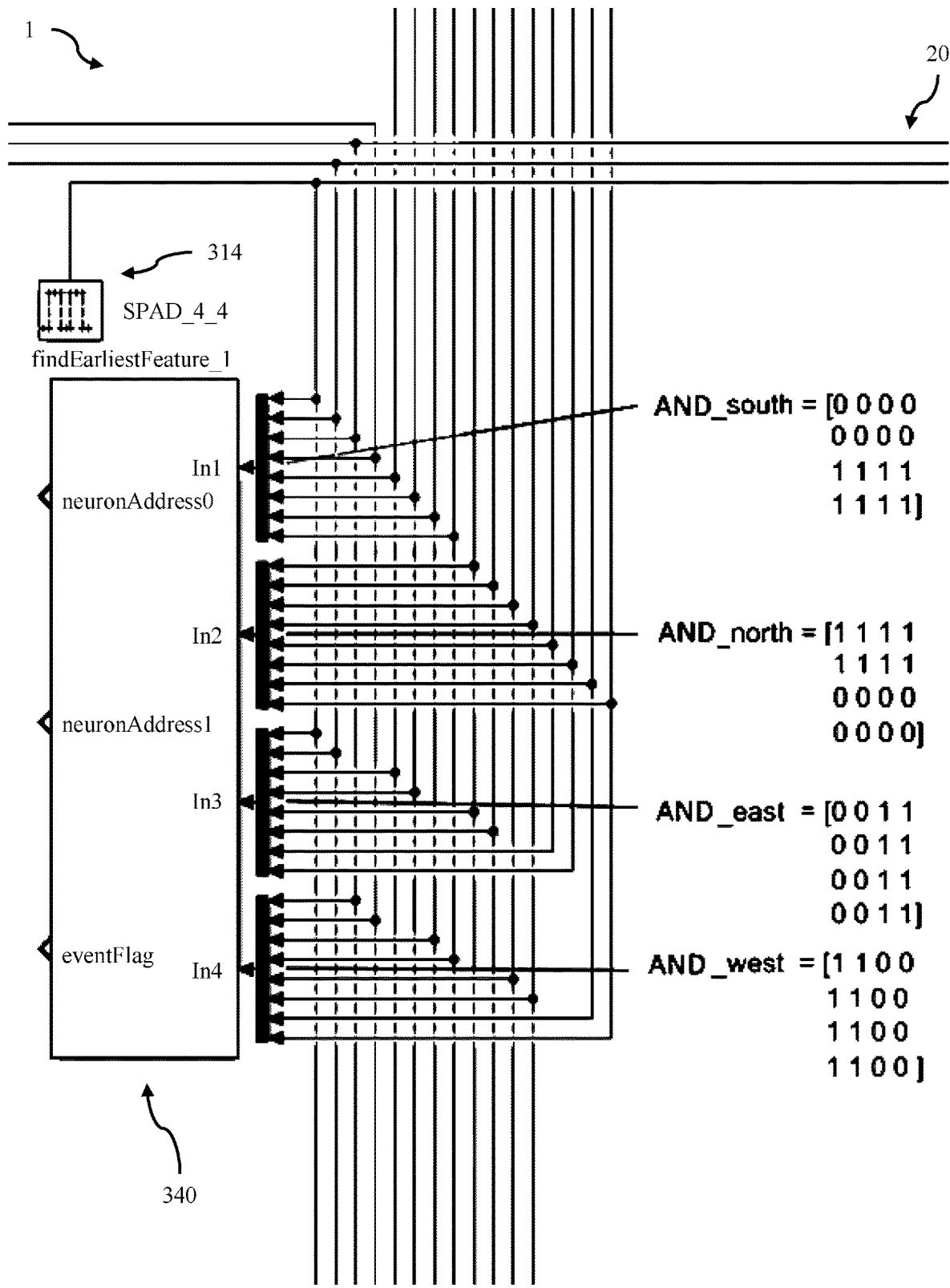
FIG. 3B is a close up of the wiring diagram of the receptive field circuit and event generation circuit in FIG. 3A according to an embodiment.

This is illustrated in FIG. 3A is a schematic wiring diagram of the 5×5 imager with four 4×4 receptive fields shown in FIG. 2A where each receptive field is connected to four AND gates a according to an embodiment. FIG. 3B is a close up of the wiring diagram of the receptive field circuit and event generation circuit in FIG. 3A according to an embodiment. A first receptive field 320 rf(1,1) comprises a neural feature circuit 320 with a 2×4 geometry of highlighted SPADS (in red), labelled 301, 302, 303, and 304 (row 3); and 311, 312, 313, and 314 (row 4). Column 5 SPAD 304 in row 3 and SPAD 315 in row 5 are not part of this receptive field. The wires carry binary on/off values from the SPAD sensors (trigger output) to four AND gates labelled AND_south, AND_north, AND east and AND_west as shown in FIG. 3B. The AND_south gate receives inputs from neural feature circuit 320 (SPADs 301, 302, 303, 304, 311, 312, 313, and 314). The output of AND_south is provides as input In1 to event circuit 340. Similarly the three other AND gates for the three other neural feature circuits are provided to inputs In2 In3 and In4 of the event circuit 340. Note that if only the highlighted SPADS (in red, labelled 301, 302, 303, 304, 311, 312, 313, and 314) latch at $t=t_1$ then the AND_south (or AND(1,1,3)) will latch at $t=t_1$.

The event circuit 340 is configured to generate an event trigger for the receptive field if one of the input neural feature subgroup triggers. As will be discussed below, the trigger is only generated if the neural feature circuit which triggered is the first in the receptive field to trigger in the timing interval or if the triggered neural feature circuit is different to the neural feature circuit which previously triggered in the timing interval for this receptive field.

If a trigger (EventFlag) is generated by the event trigger then the address of the neural feature is read out (e.g. using neuronAddress0 for the row, and neuronAddress2 for the column) on a data bus. This may be the (row, column) address of the receptive field, e.g. rc(1, 1) and the identifier, e.g. In1, is read out. Alternatively the addresses of the SPADs could be read out.

Figure 4A:
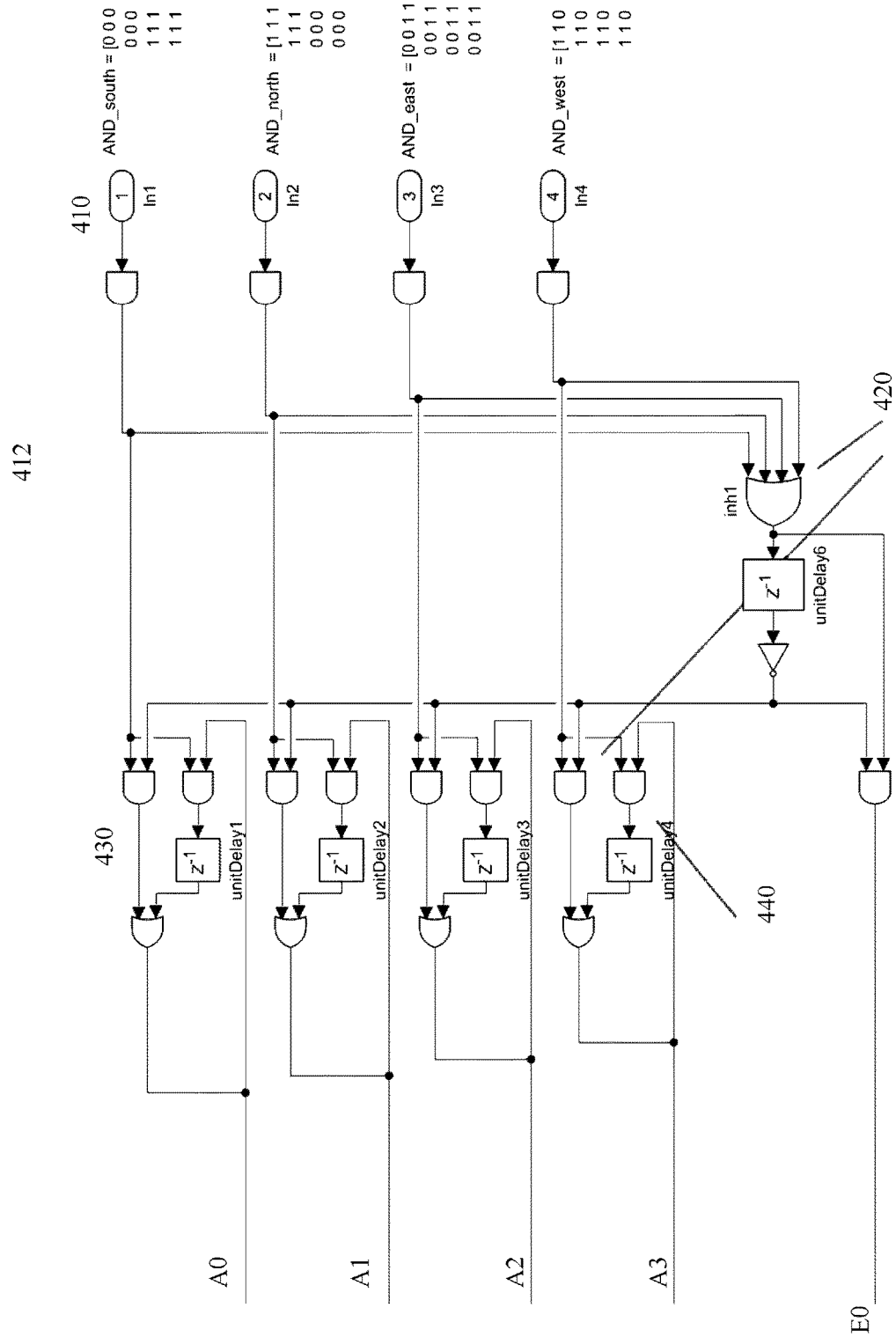
FIG. 4A is a detailed block diagram of a first part of the feature detection circuit for each receptive field according to an embodiment.
Figure 4B:
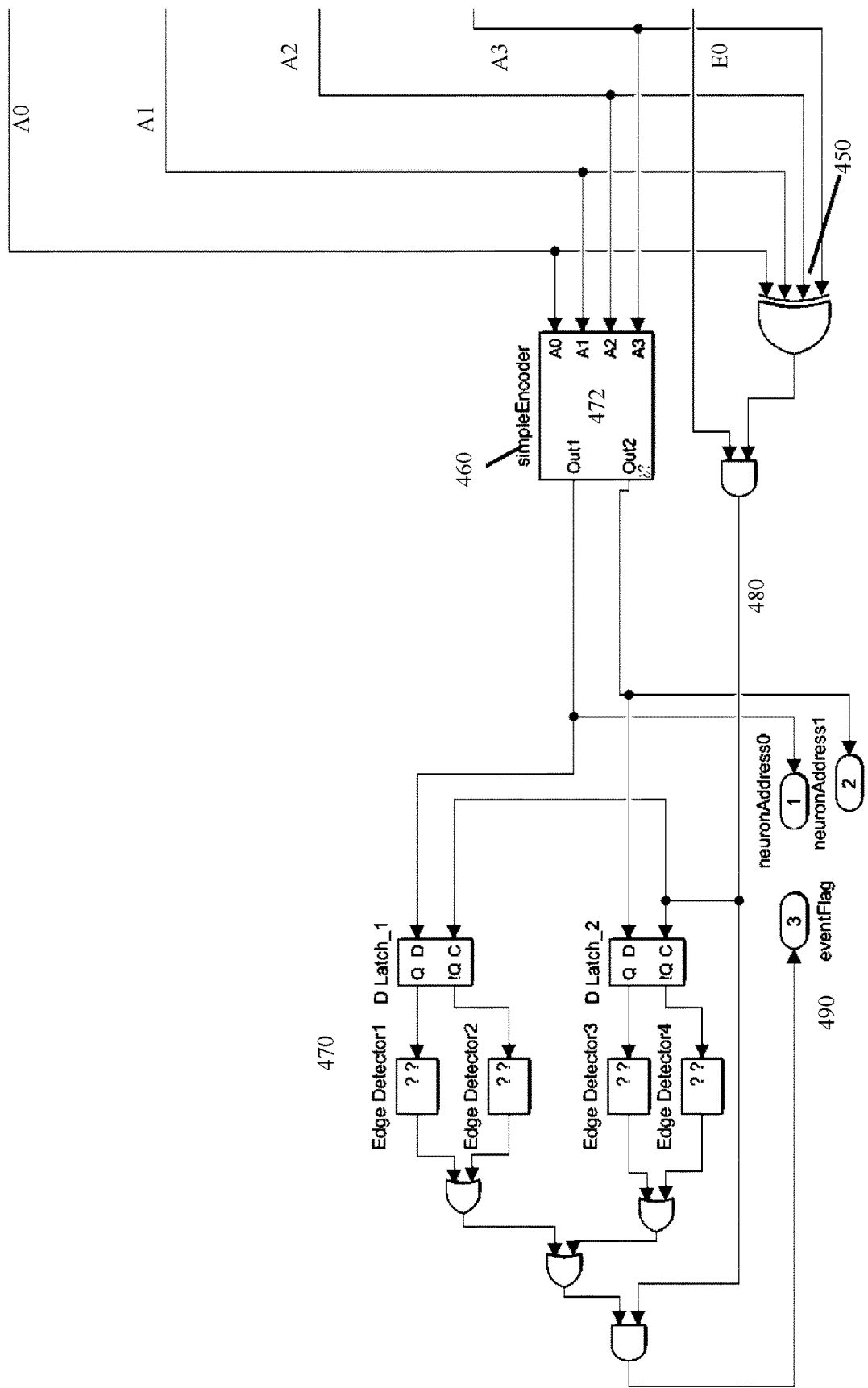
FIG. 4B is a detailed block diagram of a second part of the feature detection circuit for each receptive field according to an embodiment

FIGS. 4A and 4B are detailed block diagram of a first and second part of the feature detection circuit 340 for each receptive field according to an embodiment.

Block 410 shows the AND gates of all the inputs SPADS (all neural feature circuits) Signals 412 are the neuron spikes, the AND gate latches and stays high.

At block 420 this NOR is an inhibitory signal. When all neural circuits (or neurons) are at zero this signal is 1. If any of the neural circuits (neurons) go to one (i.e. detect their hardwired feature) this signal goes to zero. By being ANDed with the neuron's output this inhibitory signal prevents later neural circuits (neurons) from triggering (spiking). Block 422 shows the rising edge of the first trigger (spike).

The logic in Block 430 together with the inhibitory NOR signal 420 ensures only the neural feature circuit which triggered (spiked) first will have its output signal (spike) pass this section. It's possible that two (or more neurons) reach their threshold at almost exactly the same time. In this case both the neuron's spikes will pass through this logic.

Meanwhile at Block 440 the neuron which itself caused the initial activation of the inhibitory signal is protected from this inhibitory signal by having a second pathway which allows the neuron to continue spiking if in the last time step it was already spiking. Note special attention needs to be paid to the timings in these signals. They need to be aligned. They are shown in a perfect ideal implementation here but it is sufficient if the feedback path (which allows the winning neuron to continue passing its spike) gets engaged before the inhibitory signal goes high and blocks the feedforward path.

Outputs A0 to A3 indicate the winning AND gate or feature that has been detected while the E0 output acts as an enable signal for the generation of a feature event in the subsequent feature event generation subsystem (FIG. 4B).

At block 450 this XOR gate makes sure only cases where only a single neuron spikes pass through. If 0,2,3 . . . neurons spike the output will be zero.

At block 460 we encode the value of which neuron spiked using 2 bits. There are four neurons (1 2 3 4), Therefore they can be encoded using 2 bits (00 01 10 11). Given that only one spikes at a time, we can enforce this only-one-neuron-can-spike-rule using the XOR gate at the bottom. This has a trade off as there is some loss of accuracy by throwing out simultaneous spikes but the advantage is that we cut down on the signal traffic coming out of the receptive field and also simplify the circuit. Simple Encoder 462 outputs the neuron address0 and neuron address 1 lines. At block 470 if, there was only a single winning neuron then update the memory of this receptive field, i.e. update the memory of which single neuron last won in this receptive field. These blocks implement a memory for the previous neural circuit that triggered.

At block 480 an extra delay could be added here in case the XOR block needs to settled and does not inappropriately output a short pulse.

At block 490 if, the updated winning neuron is not the same as the winning neuron we had already had in memory then generate a feature event (event Flag 3). This triggers reading out of the event for example via the AER bus.

An important edge case here is the situation where two or more ANDs latch at exactly the same time. For the synchronous case this means that the ANDs latch on the same clock cycle. In the asynchronous case this means one or more ANDs latch during the time it takes for the disable signal to circle back to the inputs of the ANDs. For this edge case a checking and/or arbitration logic can be used to either randomly select a winning AND or more preferably to discount the result of this receptive field AND network for this laser pulse. This can be done in the synchronous case by using an XOR operation at the AND output. This creates three possible states in the system:

When, after a laser pulse, no AND has yet latched (i.e. no photons detected) then the XOR is off and the OR of the ANDS are off which means for this receptive field is still waiting for a winning AND;

If only one AND latches over a clock cycle then the OR of the ANDs is on and the XOR is on so we have success;

If two or more ANDs have latched at the same clock cycle in the synchronous case or very closely in time in the asynchronous case then there are multiple ANDs latched so the OR of the ANDs is on but the XOR is off so this is a fail. When these multi-latch fails happen after a laser pulse then the pulse can be ignored.

If one and only one AND (neural feature circuit) latched (i.e. a unique feature was detected then this is stored locally and sent off the chip if it's a new feature to have triggered. Each receptive field only requires a single memory slot where it stores which feature was detected most recently (a two bit address), and an output line to indicate a successful feature detection. In theory the feature memory would hold an accurate representation of the 3D geometry in front of the camera at the most recent pulse. If this ideal case were true (and if we wished to minimise the chip output data-rate) after each successful laser pulse where only a single feature was detected the logic would check to see if this most recently detected feature is the same as the one in memory if so, there is no need to transmit it out since nothing has changed at this receptive field. If on the other hand the feature detected at this receptive field at this most recent pulse is different from the one in memory then we generate an feature event by storing the new feature in memory, setting the event flag high and sending the 2 bit feature address out on an Address Event Representation (AER) bus. By only sending out events when a new feature is detected a significant redundancy is removed.

In order to make the system robust to anticipated noise we now add a feature detection success counter to this system. In a first embodiment, every time a detected feature in a receptive field is the same as the one already in memory for that receptive field, the counter increments by one. If after a pulse the feature detection counter of a receptive field reaches a predefined threshold value then the receptive field creates a feature event and the counter is set to zero. For example in the case of 3 bit counter this predefined threshold value could be up to 7. In another embodiment the counter can be decremented. That is every time a detected feature in a receptive field is the same as the one already in memory for that receptive field, the counter increments by one. Every time the newly detected feature is different from the one already in memory, the counter is decremented by one. If after a pulse the feature detection counter of a receptive field reaches our predefined threshold value then the receptive field creates a feature event and the counter is set to zero. On the other hand if after a laser pulse the counter reaches zero after a decrementation then the newly detected feature which caused the decrementation replaces the old feature that was in memory. That is the counter is incremented if the neural feature circuit which generated the neural feature trigger signal is the first neural feature circuit in the receptive field to trigger in the timing interval or if the identifier of the neural feature circuit that generated the neural feature trigger is the same as the identifier stored in the memory. Otherwise the counter is decremented if the value of the counter is greater than zero. An event trigger is generated when the counter is equal to a predetermined threshold value. This is fixed for at least the timing interval.

In this way a constantly noiselessly detected feature will periodically (period=threshold*inter-pulse period) send out a confirmatory feature event whereas receptive fields where no AND feature consistently wins will not output any features. By decreasing the threshold down, as we are able to do globally for the entire chip, we can decrease the number of times a feature must be detected before it triggers a feature event. This reduction in threshold increases the data-rate and allows features whose verity is less certain to be transmitted. On the other hand a higher threshold increases the certainty about the transmitted features and reduces the data rate.

In one embodiment, in order to reduce the potential effect of inherent internal delays in the chip activating SPAD and therefor the ANDs in a systematic persistent order we can sample the SPAD at a lower resolution. In this way timing measurements are effectively flattened. Effectively we are pooling over time by sampling the SPAD latching events at low temporal resolution.

Thus to summarise, in one embodiment the chip operates in timing mode, so on synchronization to a laser pulse, each laser pulse presents the start of a new frame. The "n_reset_start" input resets the SPADs and starts a new timing interval with the laser.

When SPADs avalanche on chip they are synchronously latched to the CLK (configured via PLL or fed via external clk). Within each "receptive field" whichever neuron (north, south, east, west) detects its particular shape first (so a particular sequence of SPADs in the receptive field need to fire), it blocks out the other neurons from firing. This winning neuron increments a 3 bit counter. If the winning neuron is different to the previous one (i.e. from the previous laser pulse) the counter is reset to zero. If the winning neuron is the same as before, the counter is then allowed to increment. Once the counter reaches a predetermined value (this is set by the input S0/S1 lines) it triggers what is called an "event". This can be indicated by monitoring the "CA_Busy_n" output line. When this happens, the encoded row and column address of the location of this "receptive field" is output on the ra0-ra6 and ca0-ca6 lines. Also which winning neuron (north, south, east, west) for that particular receptive field is determined by monitoring the output on the d0-d3 lines. When the user has read the address/data information, the "ext-ack" input line can then be pulsed HIGH. The ext-ack signal resets the event (resets the counter) which releases the CA_Busy_n line (The event generator in a particular receptive field is reset once it receives row and column acknowledge signals as well as a global acknowledge signal, generated off chip).

For this chip the pin descriptions are:

rstn: resets the memory and counter of the receptive field circuit. Usually done only once at power up.

S0,S1: are input pins that control a 4-1 mux. Determines on what "count" an event is allowed to trigger on.

n_reset_start: input, resets the SPADs and starts a new timing interval, in sync with the laser pulses.

pwrena: input, turns individual SPADs on or off. Keep LOW.

Inhibit_trigger: input, for range gate control. Keep LOW.

ext_ackn: input, external acknowledge once address/data read.

CA_Busy_n: output, indicates when event occurs.

ra0-ra6: outputs, encoded row address for receptive field location.

ca0-ca6: outputs, encoded column address for receptive field location.

d0-d3: outputs, indicates winning neuron type for receptive field location.

The following sequence occurs on chip for an Event:

Winning neuron spikes at least 6 times over consecutive frames.

Event generation (event signal goes HIGH)
Row Request
Row Acknowledgment
Column request
Column Acknowledgement
Use row encoded address to decode on data bus.
Put neuron address on data bus (4 bits)
Use Row/Column lines to decode address
Send ext-ackn to say data/address has been read and internally reset counters (event)
Start/reset: n_reset_start.

The PLL can set the on chip CLK to 600 MHz (1.6 ns). An on chip arbiter processes the order of events as they occur, and events can be generated asynchronously. It is expected that not all events will be captured and read by the monitoring FPGA between laser pulses.

Real world SPAD array systems will be subject to noise and this will affect the operation. The effects of noise on a 32×32 SPAD camera configured as described herein will now be discussed. FIG. 5A is an experimental setup 500 of a SPAD camera system 510 comprising a laser 512 and 32×32 SPAD chip 514 with a SPAD field of view 520 marked by black dotted line a according to an embodiment. A first target 522 is a stationary B-747 model a second target 524 is a F14 model plane which is dropped through the field of view 520 (into a drop box 526). FIG. 5B shows 500 averaged frames 530 showing the stationary B-747 model 522 viewed using the experimental setup of FIG. 5A. FIG. 5C shows the result 540 of averaging 5 frames showing the F-14 model plane 524 as it drops at high speed close to the camera lens in the experimental setup of FIG. 5A.

Figure 5D:
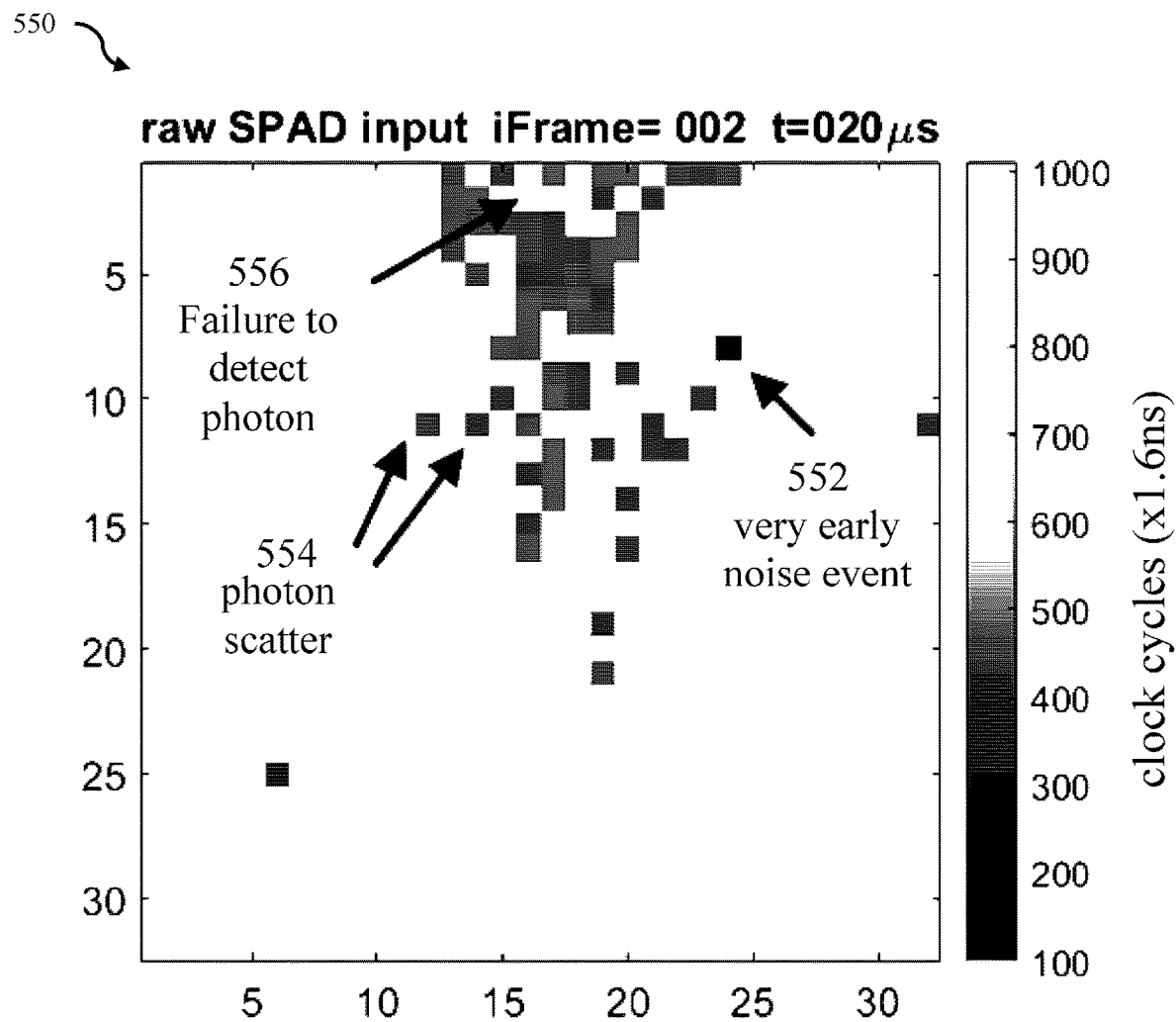
FIG. 5D is a representation of a raw SPAD input showing common sources of noise according to an embodiment.

False positives, False negatives and imprecise timing measurement are also sources of noise. One source is that of a stray photon emanating not from the laser but from the environment which can trigger the SPAD cells. This is shown in FIG. 5D where a SPAD cell 552 is activated within ~100 clock cycles due to a stray photon from a light source that is not the laser. Another source of noise is photon scatter 554 from a true target reflecting the probing laser but which are reflected off other objects or even the lens and land on to an "incorrect" pixel. A possible example this is marked in FIG. 5D.

Figure 5E:
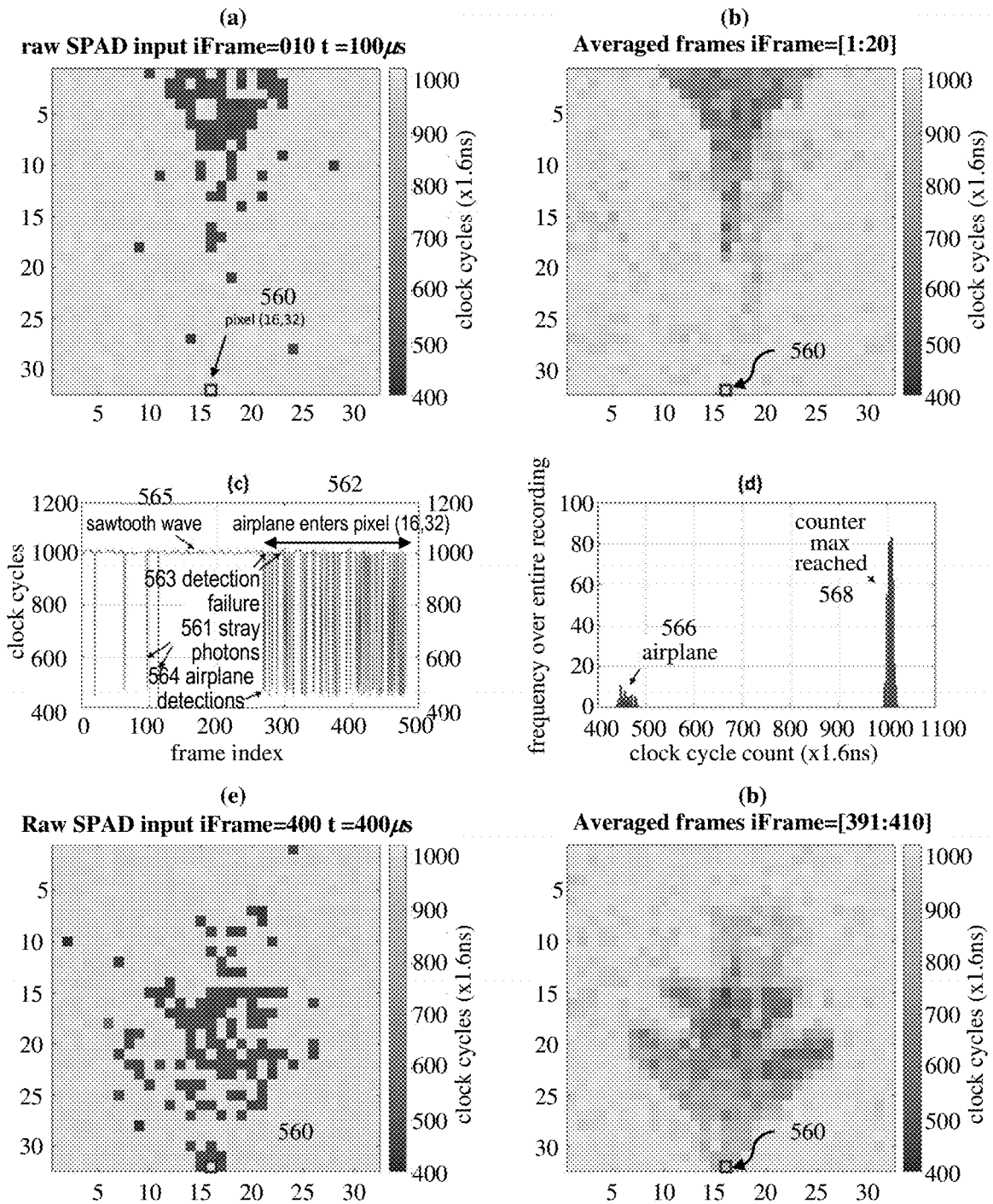
FIG. 5E is a representation of SPAD activation across pixels and time according to an embodiment.

FIG. 5E shows panels (a) to (f) to show how imprecise measurement of photons in time is another source of noise. Panel (a) shows an image of the $10^{th}$ frame at 100 us with a pixel 560 at location (16,32) marked by the red box and panel (b) shows the average of the first 20 frames showing the plane in the upper part of the image. Panel (c) shows the timing distribution for pixel 560 showing the trigger time in clock cycles (y axis) over 500 frames (x axis). If there is no detection in a given frame (556) the counter reaches a maximum of around 1000 and if the pixel (SPAD) triggers the spike is generated. Before the plane enters the field of view of pixel 560 stray photons 561 cause early triggering. Once the plane is in the field of view 562, airplane detections occur (spikes) 564, and there are also detection failures 563 (counter maxes out). Panel (d) shows a histogram of the clock cycle of the triggering of pixel 560 over the 500 frames with an airplane peak 566 around 450 cycles and a max counter peak around 1000. These show variance in timing measurement as airplane peak 566 spans around 40 clock cycles whereas the timing should at most be distributed over two clock cycles since each clock cycles covers a 0.48 meter distance. The imprecise measurement of photons in time is also seen in the background where an apparent sawtooth wave 565 is seen in panel c (possibly related to the counter) and in panel d where the counter max peak 568 spans around 28 clock cycles.

Figure 6:
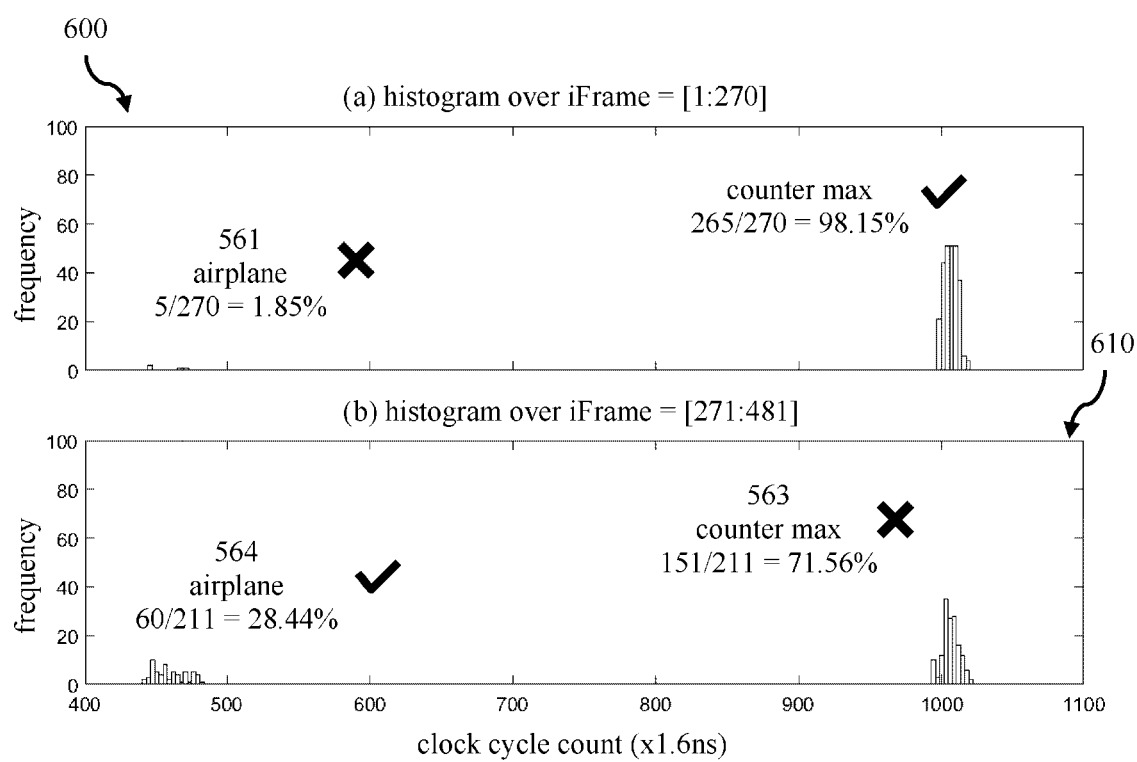
FIG. 6A is a histogram over frames 1 to 270 showing stray photons vs. missed detection when the airplane was not in front of the pixel where a cross indicates false positives.
FIG. 6B is a histogram over frames 271 to 481 showing stray photons vs. missed detection when the airplane was in front of the pixel where a cross indicates false negatives.

FIGS. 6A and 6B shows that for the pixel 560 in our experiment the probability of a large error in timing measurement due to missed detection is significantly higher than the error due to stray photons. FIG. 6A is a histogram 600 over frames 1 to 270 showing stray photons 561 vs. no detection when the airplane was not in front of the pixel, where a cross indicates false positives. Five (out of 270) false positives were detected corresponding to 1.85%. FIG. 6B is a histogram 610 over frames 271 to 481 showing airplane photons 564 vs. missed detection 563 when the airplane was in front of the pixel, where a cross indicates false negatives. A total of 151 (out of 211) false negatives were generated corresponding to 72% (i.e. the airplane detection rate was 28%).

Another potential source of noise and one which can impact on the design is persistent non-ideal timing patterns in SPAD activation timings. Here persistent refers to non-ideal timing patterns which occur again and again at every laser pulse. An example of this issue potentially resulting from systematic offsets in the timing counter can be seen in FIG. 7. Persistent non-ideal timing patterns may result from unequal delays in the circuitry which systematically delay some pixels relative to others. The problem with such systemic delays can be illustrated when it is combined with an equidistant object in the field of view (imager looking directly at a flat wall). Such a combination would cause patterns to be detected by the feature detecting ANDs all across the wall due to the imperfect delays within the chip and result in all the receptive fields generating feature events when they should in fact not generate any events since the flat wall in theory should result in all the ANDs latching at the same time disabling the XOR gate.

Figure 7:
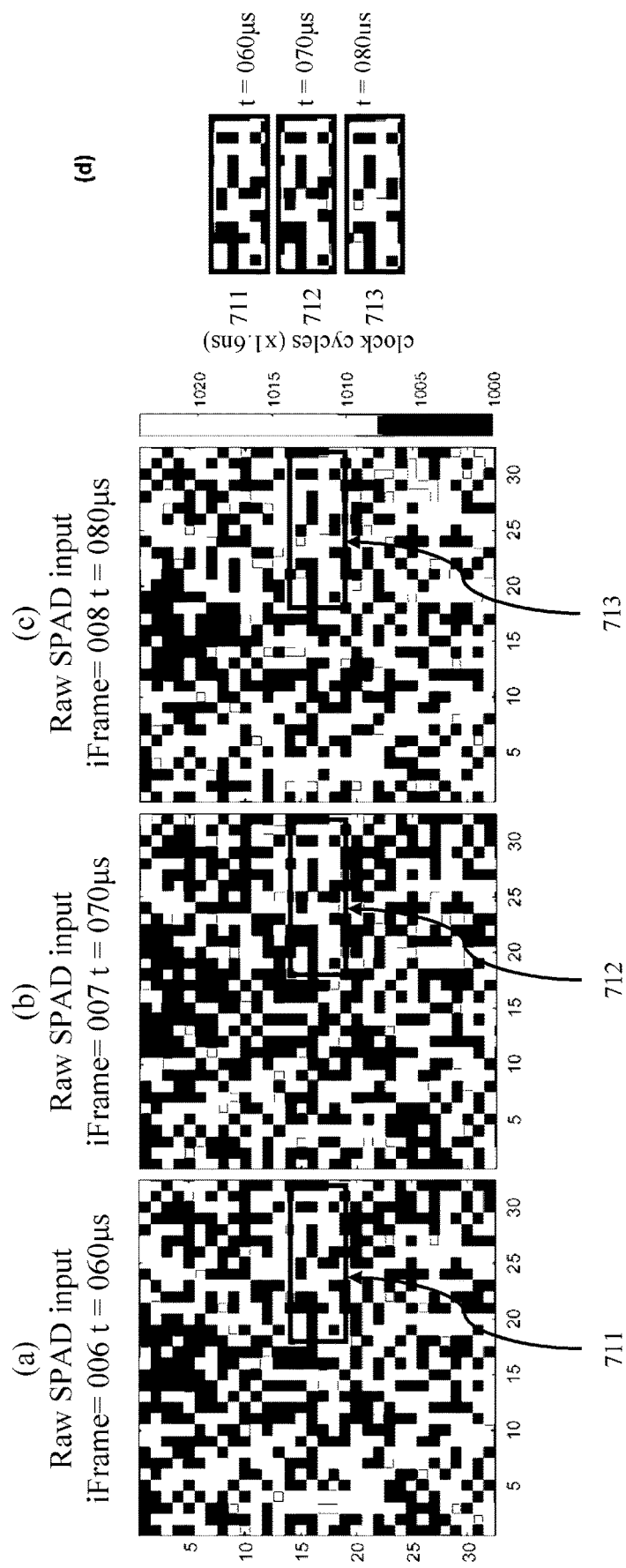
FIG. 7 shows examples of a persistent background pattern in maxed out counters where panels (a) (b) and (c) show in high contrast the timing patterns in consecutive frames for the pixels whose counters have maxed out and panel (d) highlights the persistence of the pattern by comparing a small section from each frame next to each other according to an embodiment.

FIG. 7 shows examples of a persistent background pattern in maxed out counters where panels (a) (b) and (c) show in high contrast the timing patterns in consecutive frames for the pixels whose counters have maxed out and panel (d) highlights the persistence of the pattern by comparing a small section from each frame 711 712 713 next to each other according to an embodiment.

Figure 8:
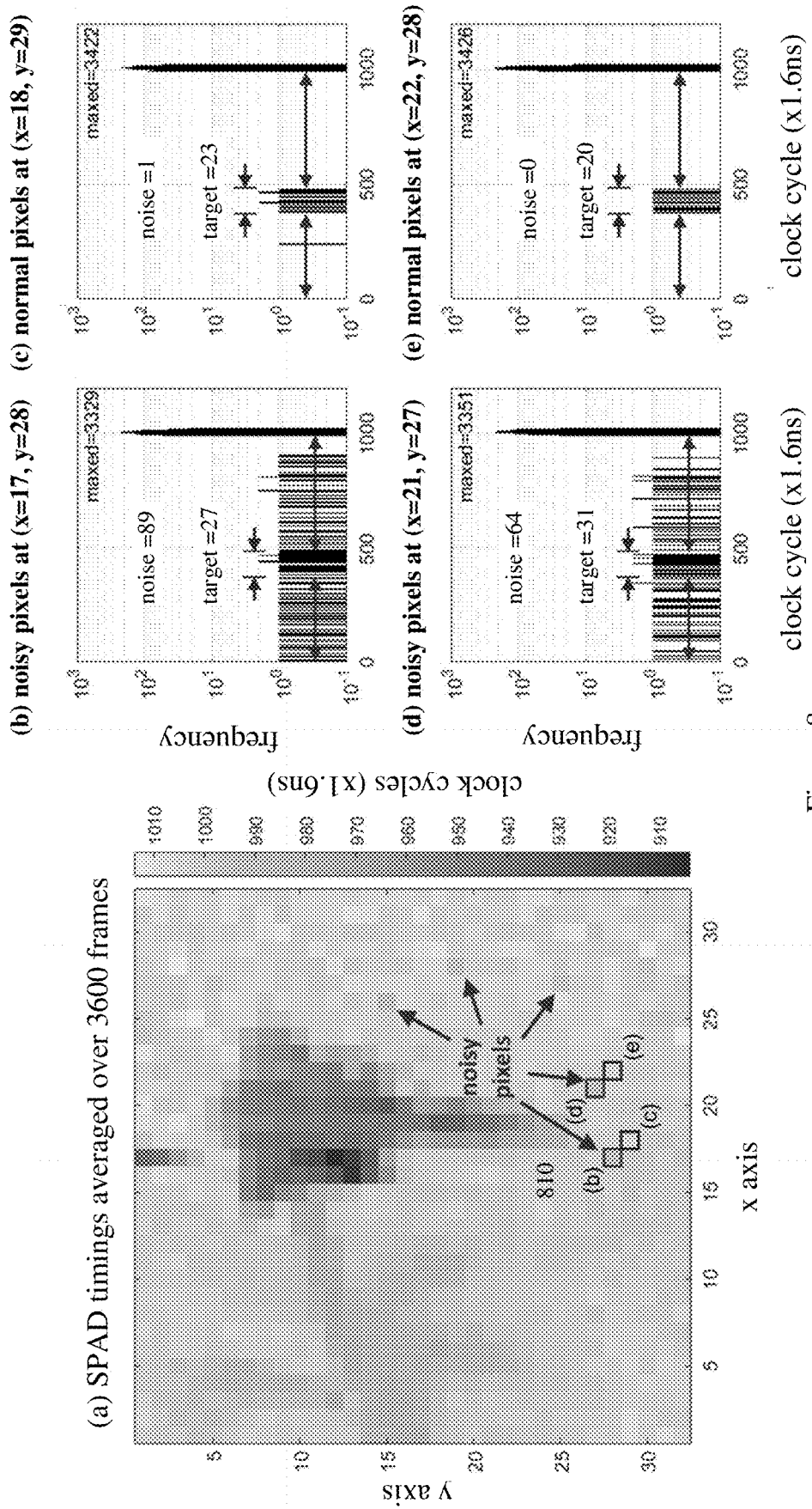
FIG. 8 is a comparison between noisy pixels and normal pixels showing SPAD timings averaged over 3600 frames according to an embodiment.

Another source of noise is pixels which in addition to being triggered by in coming photons from the laser are also triggered randomly. These non-deal latching events are different to the case of stray photons from a target illuminated by the laser (but not in the pixels field of view) or photons from other light sources such as the sun. The activation of these noisy pixels is not correlated with activation of their normally acting neighbours as would be expected if a common external noise source was triggering the random latching events. FIG. 8 illustrates the behaviour of these noisy pixels as captured in an averaged frame (over 3600 frames) where the five marked noisy pixels on FIG. 8 (a) show an on average earlier arrival time/reduced depth compared to their immediate normal neighbours. The histogram of two of the noisy pixels are shown as (b) and (d) showing an additive background noise signal in comparison to the normally functioning (c) and (e) pixels.

FIG. 8 is a comparison between noisy pixels 810 and normal pixels and panel (a) shows SPAD timings averaged over 3600 frames according to an embodiment. Panels (b), (d) show histograms of noisy pixels (b) and (d) in panel (a), and panels (c) and (e) show histograms of normal pixels (c) and (e) in panel (a) each showing the frequency per clock cycle of triggering. Note that the 'on target' time window was taken to be between 370 and 485 clock cycles based on the output of the normal pixels. However the higher number of 'on target' activations of the noisy pixels suggests an additive noise at work in the noisy pixels where in this case about a third of the on-target activations are noise events.

The effect of randomly latching noisy pixels is yet another non-ideality that must be handled by the AND based feature detecting system. Fortunately the relative rarity of these random latching events, in comparison to for example photon failure detection makes this source less of a concern. In addition due to the additive nature of the noise and the fact it is uncorrelated across neighbouring pixels means that a competitive AND gate network can readily handle this form of noise.

The all or nothing behaviour of the AND gate means that for our four 8-input AND gate design, 8 noisy pixels of a non-winning AND gate must latch earlier than their true time in order to latch earlier than a competing AND gate which is viewing a truly closer section of the scene and shares no pixels with the noisy input AND gate. For the case where a losing but noisy AND gate and a winning AND gates share 4 pixels then 4 noise induced latching events must occur on the noisy input AND gate. Even assuming a very high probability of 10% noise induced latching. And assuming a latching time at clock cycle=0, i.e. before a photon from the laser actually reaches the noisy sensor, then the probability of the noisy input AND latching at any laser pulse is 1%.

It can therefore be assumed that noisy pixels firing before their correct time are not a significant problem for the proposed design.

Figure 9:
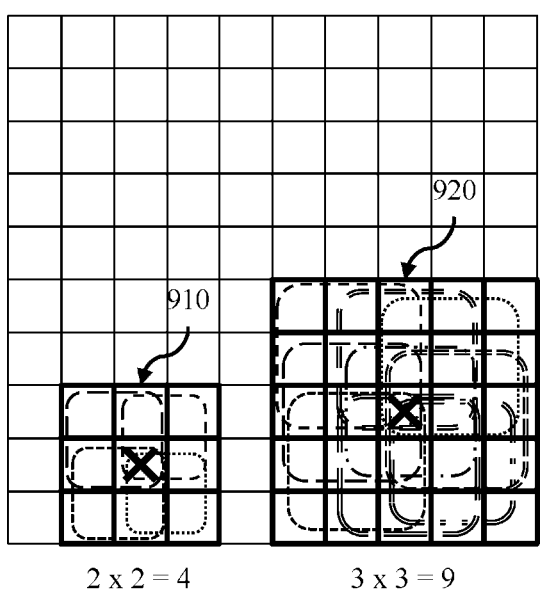
FIG. 9 is a representation showing the number of receptive fields impaired by a single photon at different receptive field sizes where X marks the dead pixel, the black grid indicated the pixel region affected by the dead pixel and the coloured squares indicate receptive fields affected by the dead pixel according to an embodiment.
Figure 9:
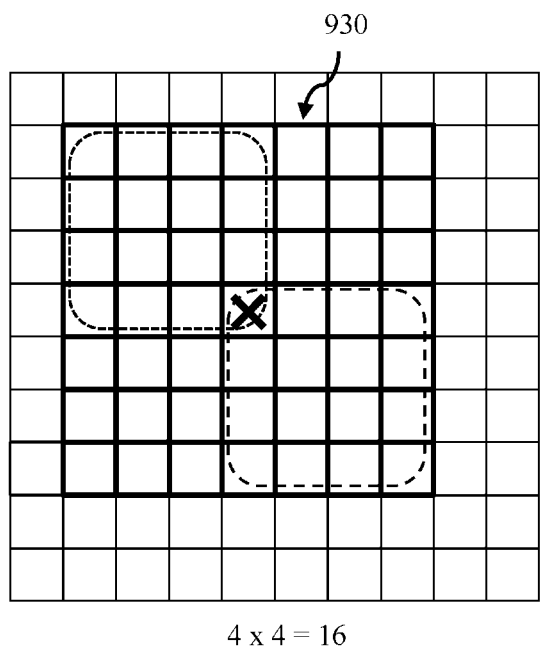

In contrast to noisy pixels, dead pixels which never latch can reduce the performance of the proposed design. This is because unlike in a simple imager, in a convolutional network the detrimental effect of a single dead pixel expands with the receptive field size as shown in FIG. 9. Such that for the 4×4 pixel receptive field as discussed above each dead pixel will disable 2 neuron features in each receptive field (as these can never trigger), and thus affect 16 receptive fields over a 7×7 pixel region. There were no such dead pixels observed in the 32×32 SPAD camera used for the experiments described herein.

FIG. 9 is a representation showing the number of receptive fields impaired by a single dead pixel at different receptive field sizes where X marks the dead pixel, the thick black grid indicates the pixel region affected by the dead pixel and the dashed squares indicate receptive fields affected by the dead pixel according to an embodiment. As shown in FIG. 9 for a 2×2 receptive field a 3×3 pixel region 910 is affected (containing 4 receptive fields each designated by a box with dotted, short dash, medium dash or long dash lines), for a 3×3 receptive field a 5×5 pixel region 920 is affected (containing 9 receptive fields, each designated by a box with different line types), and for a 4×4 receptive field a 7×7 pixel region 930 is affected (containing 16 receptive fields, or which two are represented by short dash and medium dash lines).

The design can be made robust to expected noise. As described above the most dominant source of troublesome noise for the proposed AND based system is false negative cases where the pixel does not latch during a particular laser pulse despite a target being in front of the pixel. In such a case even when all but a single pixel have latch the ground truth winning AND gate fails to latch. The best solution to this issue is to increase the illuminator power to ensure activation of pixels. This however can have drawbacks in terms of power and the safety requirements of using a high power laser illuminator. An alternate solution is to have a maximum wait time after which any remaining receptive fields without a detected feature will be assumed to have missed this pulse. Another potential solution is to implement a randomized latching mechanism to activate the remaining SPADs in a random order in a short period of time. This would be expected to latch ANDs whose inputs are already almost fully on. However if the activation order of the SPAD latches is not random from one pulse to the next this can result in false positive features being detected similar to the persistent patterns described above. One potentially randomized latching mechanism maybe a secondary light source close to the imager however such a solution is more likely to be closer to instantaneous activation of all remaining SPAD than randomly ordered.

Figure 10:
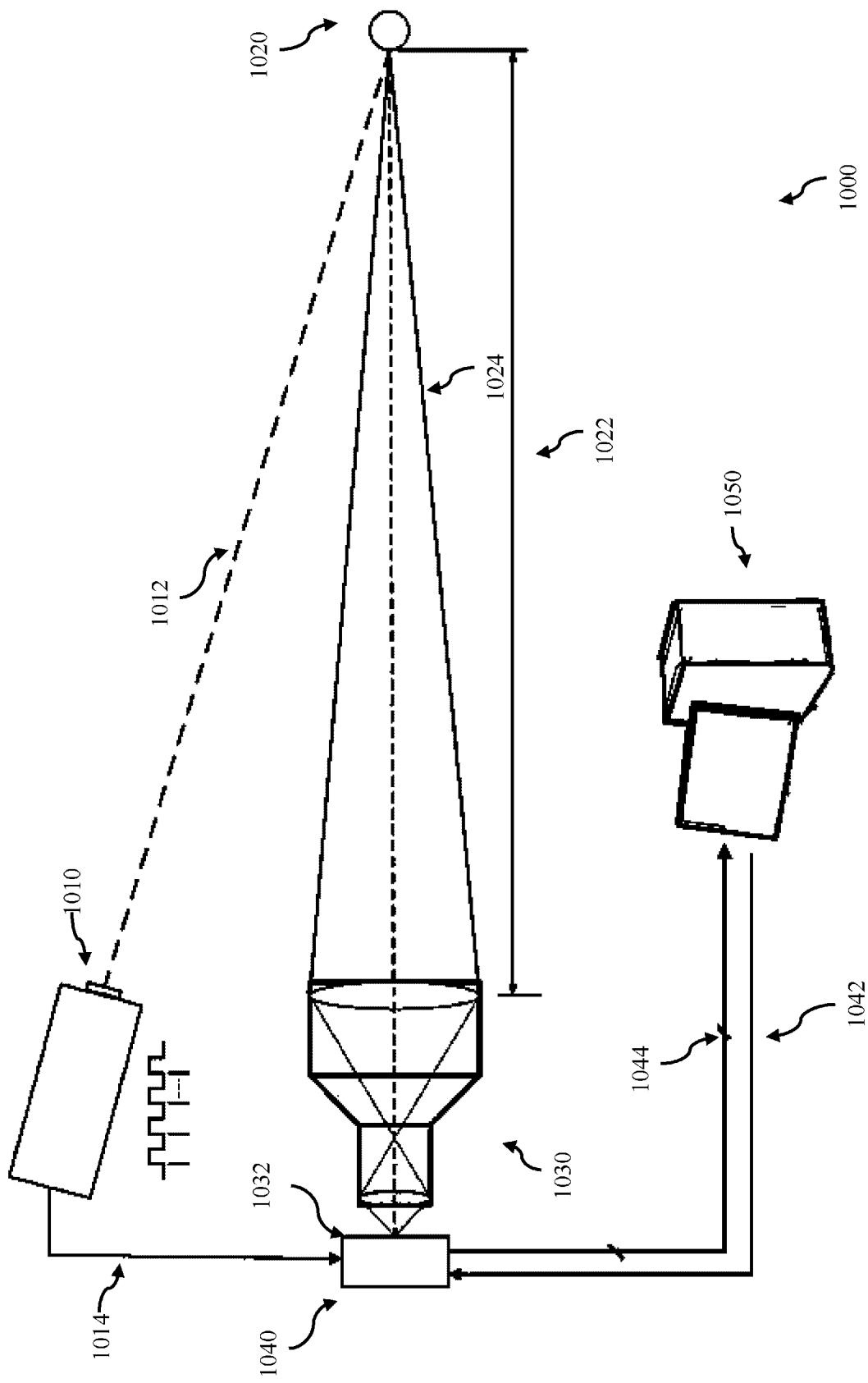
FIG. 10 is a schematic diagram of a Flash LIDAR system using a SPAD array according to an embodiment.

FIG. 10 is a schematic diagram of a Flash LADAR system 1000 using a SPAD array according to an embodiment. The system comprises a pulsed laser 1010, for example a 25-100 Hz Pulsed Green (532 nm) Laser, which fires a laser pulse 1012 at a target 1020 which is some distance 1022 from the laser, and which reflects light 1024 back to the SPAD array sensor chip 1040. Upon firing of the pulsed laser 1010 a SYNC signal 1014 is provided to the SPAD array sensor chip 1040 to reset SPADs and start counters. An optical assembly 1030 including a micro lens array 1032 focuses the reflected light from the target 1024 onto the SPAD array, triggering individual SPADs. Data from the SPAD array 1042 is sent to computing device 1050 over a bus 1044 and stored on the computer 1050.

The computing device 1050 may be a microcontroller, Field Programmable Gate Array (FPGA) or other processor based computing device such as a laptop, notebook, server, desktop, tablet, smart phone, etc. In one embodiment a FPGA board reads the ToF data from the SPAD chip and then communicates or uploads the data to a processor based computing device which displays the 3D image. The processor based computing device may be a system comprising of a display device, a processor and a memory and an input device. The memory may comprise instructions to cause the processor to execute a method described herein. The processor memory and display device may be included in a standard computing device, such as a desktop computer, a portable computing device such as a laptop computer or tablet, or they may be included in a customised device or system. The computing device may be a unitary computing or programmable device, or a distributed device comprising several components operatively (or functionally) connected via wired or wireless connections. The processor based computing device may comprises a central processing unit (CPU), a memory, a display apparatus, and may include an input device such as keyboard, mouse, etc. The CPU comprises an Input/Output Interface, an Arithmetic and Logic Unit (ALU) and a Control Unit and Program Counter element which is in communication with input and output devices (e.g. input device and display apparatus) through the Input/Output Interface. The Input/Output Interface may comprise a network interface and/or communications module for communicating with an equivalent communications module in another device using a predefined communications protocol (e.g. Bluetooth, Zigbee, IEEE 802.15, IEEE 802.11, TCP/IP, UDP, etc.). A graphical processing unit (GPU) may also be included. The display apparatus may comprise a flat screen display (e.g. LCD, LED, plasma, touch screen, etc.), a projector, CRT, etc. The computing device may comprise a single CPU (core) or multiple CPU's (multiple core), or multiple processors. The computing device may use a parallel processor, a vector processor, or be a distributed computing device. The memory is operatively coupled to the processor(s) and may comprise RAM and ROM components, and may be provided within or external to the device. The memory may be used to store the operating system and additional software modules or instructions. The processor(s) may be configured to load and executed the software modules or instructions stored in the memory.

As described herein, instead of recording and transmitting the time interval (ToF) from the start of a laser pulse (which requires resource consuming high precision on chip, per pixel counters of a relatively long time interval and a high data rate output—as all captured information needs to be transmitted off chip) the inter pixel photon arrival order (not time) is recorded and transmitted off chip. This reduces hardware resources compared to conventional DTOF SPAD arrays and results in feature information which carry more information instead of single pixel events, and increases scalability of chips manufactured in accordance with this specification. Additionally an event based AER protocol is proposed for SPAD feature events to reduce the data rate. Further, the use an on-chip counter and threshold oiler feature detection thus reducing the number of counters/threshold which are typically used per neuron. Instead they are used at the output of the neurons reducing their number by a factor of four in the embodiment described herein. Additionally the embodiments feature the use of AND gates in an imager instead of adding synaptically weighted inputs for each feature.

The "NeuroSPAD" chip architecture described herein introduces the concept of a receptive field, which takes a local group of SPAD sensors connected in a certain way and then by using simple digital circuits which emulate how neurons behave (i.e. a neuromorphic circuit), patterns within the local field are identified. Only when these unique patterns or features are identified are "events" triggered for each receptive field in the order they occur, or in an asynchronous manner. Further it is only this information (or events) that are communicated off chip not TOF data. Each neuromorphic circuit (or collection of silicon neurons) act over overlapping receptive fields, and are tiled across the entire visual spatial field of the SPAD array to a form a convolution layer.

This provides several advantages such as
minimization of circuit complexity;
SPAD cross correlation and enhanced noise immunity through receptive field interconnectivity;
inherent data convolution and data compression across the field of view;
reduction of IO bandwidth; and
real time feature extraction.

In one embodiment the SPAD array microchip is an event based neuromorphic SPAD Array with a 4×4 receptive field and 4 silicon digital AND based (neuron gate equivalent) feature detecting system. With neuron priority encoding and 3 bit adjustable counter for the winning event, information is readout via an Address Event Representation (AER) protocol. This provides an asynchronous time-of-flight (ToF) SPAD sensor with real time feature extraction for 3D imaging applications. The new chip can be constructed using CMOS technology and represents a new paradigm in target detection and recognition for ToF systems, by minimizing, susceptibility to noise, detection time and data rate output issues as compared to conventional DTOF SPAD microchips.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Software modules, also known as computer programs, computer codes, or instructions, may contain a number a number of source code or object code segments or instructions, and may reside in any computer readable medium such as a RAM memory, flash memory, ROM memory, EPROM memory, registers, hard disk, a removable disk, a CD-ROM, a DVD-ROM, a Blu-ray disc, or any other form of computer readable medium. In some aspects the computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media. In another aspect, the computer readable medium may be integral to the processor. The processor and the computer readable medium may reside in an ASIC or related device. The software codes may be stored in a memory unit and the processor may be configured to execute them. The memory unit may be implemented within the processor or external to the processor, in which case it can be communicatively coupled to the processor via various means as is known in the art.

In one form the invention may comprise a computer program product for performing the method or operations presented herein. For example, such a computer program product may comprise a computer (or processor) readable medium having instructions stored (and/or encoded) thereon, the instructions being executable by one or more processors to perform the operations described herein. For certain aspects, the computer program product may include packaging material.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the art that the disclosure is not restricted in its use to the particular application or applications described. Neither is the present disclosure restricted in its preferred embodiment with regard to the particular elements and/or features described or depicted herein. It will be appreciated that the disclosure is not limited to the embodiment or embodiments disclosed, but is capable of numerous rearrangements, modifications and substitutions without departing from the scope as set forth and defined by the following claims.

Please note that the following claims are provisional claims only, and are provided as examples of possible claims and are not intended to limit the scope of what may be claimed in any future patent applications based on the present application. Integers may be added to or omitted from the example claims at a later date so as to further define or re-define the scope.

The invention claimed is:

1. A method for operation of a Single Photon Avalanche Diode (SPAD) array microchip, the method comprising:
    detecting, on board a SPAD array microchip comprising a plurality of SPAD sensors, the triggering of one or more SPAD sensors during a timing interval comprising detecting, on board the SPAD array microchip, the triggering of a group of SPAD sensors matching one of a plurality of predefined triggering patterns during a frame, wherein the timing interval comprises one or more frames wherein a start of each frame is defined by a synchronisation signal and the triggering time of each SPAD sensor is not time stamped or recorded; and
    reading out an address of each triggered SPAD sensor, or an identifier that identifies the location of a group of triggered SPAD sensors, in the order of triggering during the timing interval comprising reading out an identifier of the triggering pattern which identifies the location of the group of SPAD sensors, or the addresses of the SPAD sensors in the group of SPAD sensors, only if the group of SPAD sensors matching the predefined pattern has not previously been detected during the timing interval.

2. The method as claimed in claim 1, wherein:
    the plurality of SPAD sensors are each associated with one or more or a plurality of receptive field groups where each receptive field groups comprises a receptive group of SPAD sensors, and different receptive field groups may share some but not all of the same SPAD sensors; and
    the plurality of predefined triggering patterns comprises a plurality of neural feature subgroups where each receptive field comprises two or more neural feature subgroups where the respective neural feature subgroups comprise different subgroups of the SPAD sensors from the receptive group of SPAD sensors; and
    detecting the triggering of a group of SPAD sensors matching one of a plurality of predefined triggering patterns comprises:
        detecting the triggering of a neural feature subgroup of a receptive field, and wherein upon detection the triggering of each other neural feature subgroup in the same receptive field group is suppressed until the end of the current frame;
        generating an event trigger for the receptive field group if the triggered neural feature subgroup is the first neural feature subgroup in the receptive field to trigger in the timing interval or if the triggered neural feature subgroup is different to the neural feature subgroup which previously triggered in the timing interval for this receptive field;
        and the step of reading out an identifier is performed upon generation of an event trigger, and comprises reading an address of the neural feature subgroup that triggered.

3. The method as claimed in claim 2, wherein generating an event trigger for the receptive field group further comprises
    incrementing a counter if the neural feature subgroup that triggered is the same neural feature subgroup that generated the previous trigger or the counter is zero;
    generating an event trigger for the receptive field group only when the counter reaches a predefined counter threshold value wherein the predefined counter threshold value is fixed for at least the timing interval.

4. The method as claimed in claim 3, wherein the counter is decremented if the counter is greater than zero and the neural feature subgroup that triggered is not the same neural feature subgroup that generated the previous trigger.

5. The method as claimed in claim 2, wherein each receptive field group has the same geometry each of the neural feature subgroups in a receptive field group comprises the same number of SPAD sensors.

6. The method as claimed in claim 5, wherein the plurality of SPAD sensors are arranged in a R×C grid, and each receptive field group is an r×r array of SPAD sensors, and the plurality of receptive field groups overlap, and the plurality of overlapping receptive field groups tile the R×C grid.

7. The method as claimed in claim 5, wherein each neural feature group comprises a contiguous block of the r×r array of SPAD sensors in the receptive field group.

8. The method as claimed in claim 5, wherein r=4, and each neural feature group comprises a block of 8 adjacent SPAD sensors arranged in a 2×4 or 4×2 grid.

9. The method as claimed in claim 2, wherein after reading out an identifier the plurality of SPADs are reset and the current frame ends, an in use the synchronisation signal is synchronised to the firing of a laser pulse.

10. A Single-Photon Avalanche Diode (SPAD) array microchip comprising:
   a plurality of SPAD sensors;
   a triggering circuit configured to detect and read out the triggering order of SPAD sensors over a timing interval wherein the timing interval comprises one or more frames wherein a start of each frame is defined by a synchronisation signal and the triggering time of each SPAD sensor is not time stamped or recorded and the triggering circuit comprises:
      a plurality of feature detection circuits, each feature detection circuit connected to a group of SPAD sensors and configured to generate a feature trigger when the connected SPADs satisfy a triggering criteria; and
      an event detection circuit configured to detect the first time a feature trigger is generated by a feature detection circuit during a timing interval wherein the timing interval comprises one or more frames and to read out the address of either the feature detection circuit or the connected SPAD sensors off the microchip.

11. The SPAD array microchip as claimed in claim 10, wherein the feature detection circuits are neural feature detection circuits and the triggering circuit further comprises:
   a plurality of receptive field circuits wherein each receptive field circuit comprises:
      a receptive group of SPAD sensors;
      two or more neural feature circuits, wherein each neural feature circuit comprises a subgroup of SPAD sensors in the receptive group of SPAD sensors where the respective neural feature subgroups comprise different subgroups of the SPAD sensors from the receptive group of SPAD sensors, and each neural feature circuit is configured to generate a neural feature trigger signal and an inhibit signal if all the SPAD sensors in the subgroup trigger, wherein the inhibit signal prevents triggering of the other neural feature circuits in the same receptive field circuit during the current frame;
      the event detection circuit comprises an event detection circuit for each receptive field circuit which is configured to monitor the neural feature circuits for generation of a neural feature trigger signal, and generates an event trigger for the receptive field circuit if the neural feature circuit which generated the neural feature trigger signal is the first neural feature circuit in the receptive field to trigger in the timing interval or if the triggered neural feature subgroup is different to the neural feature circuit most previously triggered in the timing interval; and
      the triggering circuit further comprises a read out circuit which detects an event trigger from a receptive field circuit, and on detection of an event trigger it reads an address of the neural feature circuit that triggered generation of the event trigger.

12. The SPAD array microchip as claimed in claim 11, each receptive field circuit further comprises a memory, and when a neural feature trigger signal is generated an identifier of the neural feature circuit that generated the neural feature trigger signal in stored in the memory, and the event detection circuit is configured to determine if the neural feature circuit which generated the neural feature trigger signal is the first neural feature circuit in the receptive field to trigger in the timing interval or if the triggered neural feature subgroup is different to the neural feature circuit most previously triggered in the timing interval by comparing an identifier of the neural feature circuit that generated the neural feature trigger with the identifier stored in the memory.

13. The SPAD array microchip as claimed in claim 12, wherein each receptive field circuit further comprises a counter wherein the counter is incremented the neural feature circuit which generated the neural feature trigger signal is the first neural feature circuit in the receptive field to trigger in the timing interval or if the identifier of the neural feature circuit that generated the neural feature trigger is the same as the identifier stored in the memory, and an event trigger is generated when the counter is equal to a predetermined threshold value fixed for at least the timing interval.

14. The SPAD array microchip as claimed in claim 13, wherein the counter is decremented if the counter is greater than zero and the neural feature subgroup that triggered is not the same neural feature subgroup that generated the previous trigger.

15. The SPAD array microchip as claimed in claim 13, wherein the predetermined threshold value is adjustable between timing intervals.

16. The SPAD array microchip as claimed in claim 12, wherein each of the neural feature circuits in a receptive field comprises the same number of SPAD sensors.

17. The SPAD array microchip as claimed in claim 16, wherein the plurality of SPAD sensors are arranged in a R×C grid, each receptive field circuits is an r×r array of SPAD sensors, and the plurality of receptive field circuits overlap, and the plurality of overlapping receptive field circuit tile the R×C grid.

18. The SPAD array microchip as claimed in claim 17, wherein each neural feature circuit comprises a contiguous block of the r×r array of SPAD sensors in the receptive field circuit.

19. The SPAD array microchip as claimed in claim 18, wherein r=4, and each neural feature circuit comprises a block of 8 adjacent SPAD sensors arranged in a 2×4 or 4×2 grid.

20. The SPAD array microchip as claimed in claim 12, wherein each neural feature circuit comprises a logical circuit which ANDs each of the subgroup of SPAD sensors.

21. The SPAD array microchip as claimed in claim 10 wherein the chip further comprises a data bus and an Address Event Representation protocol is used to read data off the microchip.

22. The SPAD array microchip as claimed in claim 10 wherein after reading out the address the plurality of SPAD sensors are reset and the current frame ends, an in use the synchronisation signal is synchronised to the firing of a laser pulse.

* * * * *